United States Patent [19]

Nikawa

[11] Patent Number: 5,804,980

[45] Date of Patent: Sep. 8, 1998

[54] METHOD AND SYSTEM FOR TESTING AN INTERCONNECTION IN A SEMICONDUCTOR INTEGRATED CIRCUIT

[75] Inventor: Kiyoshi Nikawa, Tokyo, Japan

[73] Assignee: NEC Corporation, Japan

[21] Appl. No.: 520,501

[22] Filed: Aug. 29, 1995

[30] Foreign Application Priority Data

| Aug. 31, 1994 | [JP] | Japan | 6-230672 |
| Oct. 3, 1994 | [JP] | Japan | 6-238802 |
| Feb. 15, 1995 | [JP] | Japan | 7-025758 |

[51] Int. Cl.$^6$ .......................... G01R 31/02; H01H 31/04
[52] U.S. Cl. .......................... 324/752; 324/538; 324/751
[58] Field of Search ........................ 324/752, 751, 324/765, 769, 750, 753, 500, 501, 538

[56] References Cited

U.S. PATENT DOCUMENTS

| 4,755,748 | 7/1988 | Lin | 324/765 |
| 5,420,522 | 5/1995 | Smayling | 324/765 |
| 5,459,404 | 10/1995 | Josephs | 324/762 |

FOREIGN PATENT DOCUMENTS

| 6-300824 | 10/1994 | Japan . |

OTHER PUBLICATIONS

T. Koyama et al., "Bias–Free Evaluation Technique for Al Interconnects With High Sensitive OBIC", Extended Abstracts (The 55th Autumn Meeting, Sep. 1994), The Japan Society of Applied Physics, (22a–ZP–10), p. 586.

K. Nikawa et al., "Novel Al Stripe Voids Detection Technique Using Optical Beam Induced Resistance Change: OBIRCH(2)", Extended Abtracts (The 41st Spring Meeting, Mar. 1994), The Japan Society of Applied Physics and Related Societies, (28p–ZH–13), p. 629.

M. Sanada et al., "Evaluation and Detection of CMOS–LSI With Abnormal $I_{DDQ}$", 125th research meeting document for the Japanese Science Promotion Association 132 Committee, pp. 7–12, Dec. 1993.

K. Nikawa et al., "Novel Al Stripe Voids Detection Technique Using Optical Beam Induced Resistance Change: OBIRCH", Extended Abtracts (The 54th Autumn Meeting, Sep. 1993), The Japan Society of Applied Physics, (27p–ZE–13), p. 655.

A.N. Campbell et al., "Internal Current Probing of Integrated Circuits using Magnetic Force Microscopy", IEEE/IRPS, 1993, pp. 168–177.

"Novel Method for Defect Detection in Al Stripes by Means of Laser Beam Heating and Detection of Changes in Electrical Resistance"; K. Nikawa, C. Matsumoto and S. Inoue; Jpn. J. Appl. Phys. vol. 34 (1995), pp. 2260–2265; Part I, No. 5A, May 1995.

Primary Examiner—Ernest F. Karlsen

[57] ABSTRACT

A method for estimating current or detecting defects in an interconnection by monitoring current change of the interconnection. A radiation beam such as a laser, electron or ion beam is irradiated to a subject region to be observed while scanning points of the subject region. Decrease of the supply current during the scanning is detected in the power supply line. The amount of decrease is approximately proportional to the current flowing originally. The value of the current in the interconnection or a defect existing in the interconnection can be estimated or found from the decreased amount. One of or the combination of selective scanning, threshold selection and thin film deposition makes it possible to apply this method to an actual device.

18 Claims, 25 Drawing Sheets

FIG. 19A
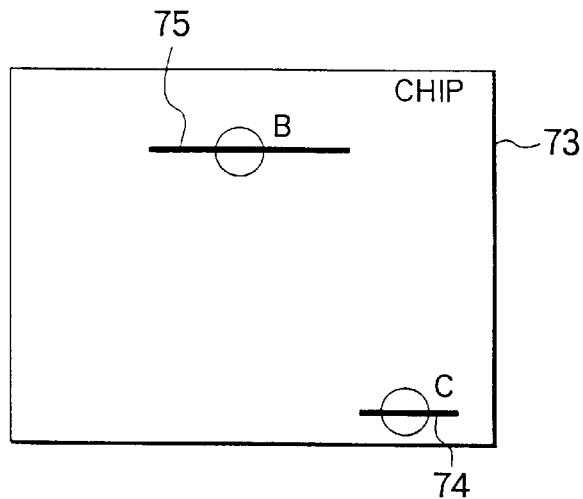
FIG. 19B          FIG. 19C
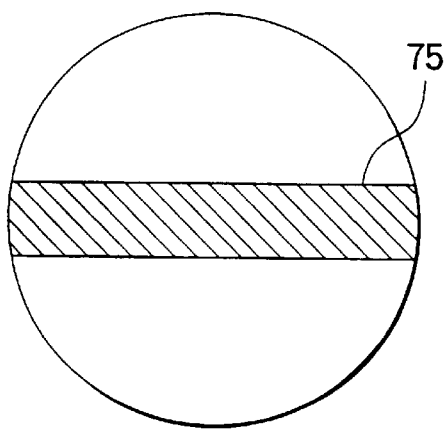 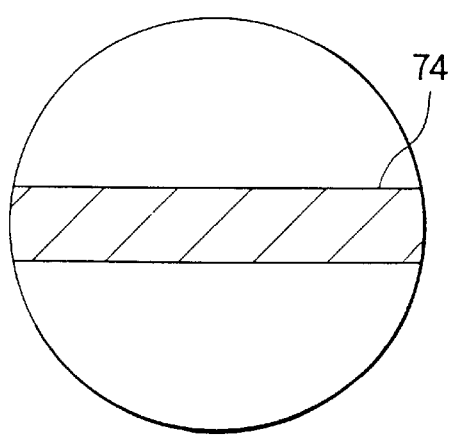
FIG. 19D          FIG. 19E
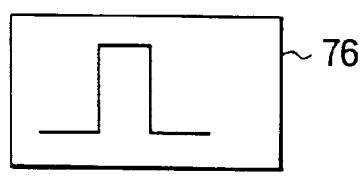 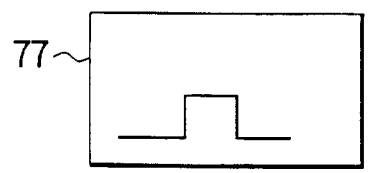

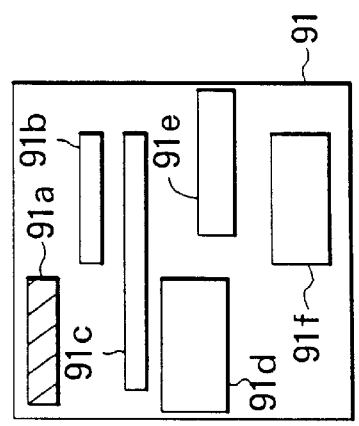
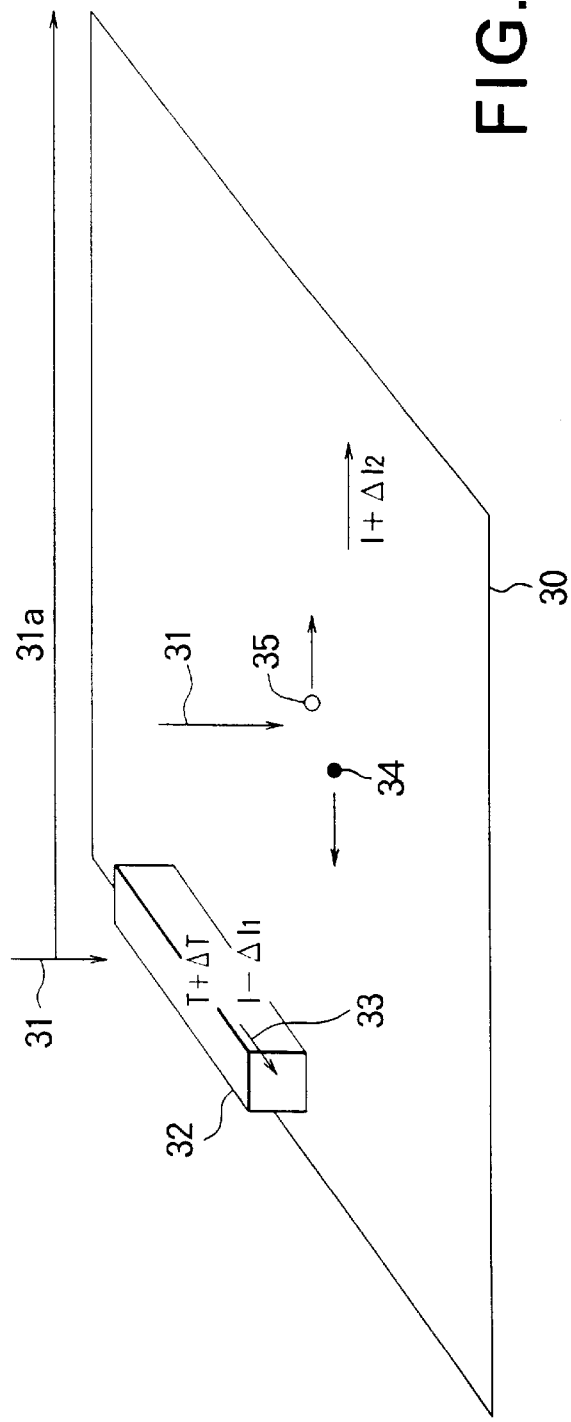

METHOD AND SYSTEM FOR TESTING AN INTERCONNECTION IN A SEMICONDUCTOR INTEGRATED CIRCUIT

BACKGROUND OF THE INVENTION (a) Field of the Invention

The present invention relates to a method and a system for testing a semiconductor integrated circuit and, more particularly, to a method and a system for estimating current, for localizing a faulty portion, or for detecting a physical defect such as voids and Si nodules, in an interconnection in a semiconductor integrated circuit by monitoring a current change for the interconnection of the semiconductor integrated circuit.

(b) Description of the Related Art

Up to now, the following methods are used for localizing a faulty portion in a semiconductor integrated circuit:

(1) A method for detecting a hot spot by using a liquid crystal (hereinafter referred to as a liquid crystal method);

(2) A method for detecting an abnormal luminescence by using an emission microscope (hereinafter referred to as an emission microscope method);

(3) A method for detecting an abnormal potential of an interconnection by using an electron beam tester (hereinafter referred to as an EBT method); and (4) A method for detecting an abnormal conductive state or current of a transistor by using an OBIC (Optical Beam Induced Current) method and so forth.

However, a method is not known for detecting a faulty portion by estimating or measuring current in the interconnection, which is important information for the semiconductor integrated circuit. Therefore, it is difficult to analyze, by a conventional method, such an abnormal state of a semiconductor integrated circuit in which the current change is large while the potential change is small.

Those methods used in the prior art are respectively employed properly based on the conditions in which the faulty portion is to be localized so as to obtain respective results. However, each of them is not all-round, and has a disadvantage as will be described with reference to the above mentioned methods (1) through (4).

(1) The liquid crystal method which is used for detecting an abnormal heat generation can only detect an electric power of about 1 milliwatt (mW), for example, in a released heat. It is extremely difficult to detect an abnormal state accompanied by a released heat below the value mentioned above. Further, it hardly detects a faulty condition in which the released heat is decreasing.

(2) The emission microscope method is generally used for detecting an abnormal state accompanied by a luminescence. However, there are many faults which are not accompanied by luminescence. Moreover, if a luminescence portion is covered by a metal wiring, the luminescence cannot be detected because of the metal wiring intercepting the luminescence.

(3) The EBT method is used to monitor the potential of the interconnection. If a subject interconnection which is to be observed is covered by a thick insulator film, it is difficult to estimate the potential of the interconnection because of a charge-up of the thick insulator film. In general, a potential difference by which the abnormal potential can be detected is, for example, about 1 volt (V) in a potential image mode. Hence, it is difficult to detect an abnormal potential, if the rise is less than the value mentioned above.

(4) In the OBIC method, electron-hole pairs are generated in the semiconductor active layer by the irradiation of a laser beam thereto. As a result, the current from a power supply unit is changed after the irradiation. The level of the change in the current from the power supply unit is varied based on the difference in the states of the transistors constituting the integrated circuit. Accordingly, the abnormal states of the transistors can be detected by monitoring the change of the current from the power supply unit. However, only the abnormal states of the transistors can be estimated by this method, and the potential or the current of the interconnection cannot be measured. Therefore, the OBIC method is not practical for localization (identification of the position) of a faulty portion in the interconnection, and not used for this purpose.

As described above, the conventional methods for detecting an abnormal heat generation, an abnormal luminescence, an abnormal potential and the like are generally used in order to localize the faulty portion of the semiconductor integrated circuit. However, each has a restriction in its practical application to the semiconductor integrated unit.

Up to now, the following methods are used for detecting physical defects such as voids and Si nodules in metal interconnects:

(1) Thermal wave modulated optical reflectance imaging (TW);

(2) The backscattered electron imaging mode of field-emission scanning electron microscopy (FE-BEM); and (3) Ultrahigh-voltage transmission electron microscopy (UHV-TEM).

These methods, however, have some disadvantages over optical beam induced resistance change (OBIRCH) method (Kiyoshi NIKAWA et al. "Novel Method for Defect Detection in Al Stripes by Means of Laser Beam Heating and Detection of Changes in Electrical Resistance", Japan Journal Appl. Phys. Vol. 34 (1995) Pt.1, No. 5A, pp.2260–2265), as summarized below with reference to the above mentioned methods (1) through (3).

(1) OBIRCH is superior to TW from the view point of data acquisition speed, which is 7200 times faster by OBIRCH than by TW. Another advantage of OBIRCH over TW is its ability to detect Si nodules: there is no report of Si nodule detection using TW.

(2) The advantages of OBIRCH over FE-BEM includes, first, its nondestructiveness: FE-BEM is a semidestructive method, and second, an ability to detect Si nodules: there is no report of Si nodule detection using FE-BEM.

(3) The advantages of OBIRCH over UHV-TEM includes, first, its nondestructiveness: UHV-TEM is a destructive method, and second, an ability to detect Si nodules: there is no report of Si nodule detection using UHV-TEM.

The OBIRCH method has been applied to test chips. The OBIRCH method, however, has not been applied to an actual device because of masking of an OBIRCH signal by an OBIC (Optical Beam Induced Current) signal. In an actual device, OBIC signal is also generated by the OBIRCH system, and usually the OBIC signal is much stronger than the OBIRCH signal. As a result, OBIRCH signal cannot be effectively detected by the system.

SUMMARY OF THE INVENTION

It is an object of the present invention to provide a new method for estimating or measuring current in an interconnection or for detecting a physical defect such as void or Si nodule in an interconnection, by monitoring current change in a semiconductor integrated circuit so as to mitigate the restrictions as mentioned above. The method for estimating current in the present invention can be applied to an actual integrated circuit as well as to a TEG (Test Element Group: a test chip specially designed for testing), thereby broadening a tool for localizing a faulty portion in a semiconductor integrated circuit.

A method in a first aspect of the present invention is directed to measuring current in an interconnection of a semiconductor integrated circuit, which includes the steps of providing a constant supply voltage to the semiconductor integrated circuit through a power supply line, irradiating a radiation beam to scan points of a matrix in a subject region including at least a portion of the interconnection, monitoring a current change in the power supply line for each of the points while the each of the points is being irradiated by the radiation beam, and displaying the current change for each of the points on a display panel.

A method in a second aspect of the present invention is directed to the method as recited in the first aspect and further includes the step of selecting at least one region in the subject region wherein the radiation beam is a laser beam or an electron beam.

A method in a third aspect of the present invention is directed to the method as recited in the first aspect and further includes the step of estimating the current change for each of the points based on the magnitude thereof with respect to at least one threshold wherein the radiation beam is a laser beam or an electron beam.

A method in a fourth aspect of the present invention is directed to the method as recited in the first aspect and further includes the step of forming on the subject region a film for absorbing the radiation beam, wherein the radiation beam is a laser beam or an electron beam.

A method in a fifth aspect of the present invention is directed to detecting a physical defect in an interconnection of a semiconductor integrated circuit, which includes the steps of providing a constant supply voltage to the integrated circuit through a supply line, selecting at least one area including at least a portion of the interconnection, irradiating a laser beam or an electron beam to scan points of a matrix in the area, monitoring a current change in the power supply line for each of the points while the each of the points is being irradiated by the beam, and displaying the current change for each of the points on a display panel.

A method in a sixth aspect of the present invention is directed to detecting a physical defect in an interconnection of a semiconductor integrated circuit, which includes the steps of providing a constant supply voltage to the integrated circuit through a supply line, irradiating a laser beam or an electron beam to scan points of a matrix in a subject region including at least a portion of the interconnection, monitoring a current change in the power supply line for each of the points while the each of the points is being irradiated by the beam, and estimating the current change for each of the points based on the magnitude thereof with respect to at least one threshold.

A method in a seventh aspect of the present invention is directed to detecting a physical defect in an interconnection of a semiconductor integrated circuit, which includes the steps of providing a constant supply voltage to the integrated circuit through a supply line, forming a film for absorbing a laser beam or an electron beam on the semiconductor integrated circuit, irradiating the laser beam or electron beam to scan points of a matrix in a subject region including at least a portion of the interconnection, monitoring a current change in the power supply line for each of the points while the each of the points is being irradiated by the beam, and displaying the current change for each of the points on a display panel.

A method in an eighth aspect of the present invention is directed to detecting a physical defect in an interconnection, which includes the steps of irradiating an ion beam or an electron beam to scan points of a matrix in a subject region including at least a portion of the interconnection without providing a supply voltage to the integrated circuit, and monitoring a current change at each of the points while the each of the points is being irradiated by the beam.

A method in a ninth aspect of the present invention is directed to detecting a physical defect in an interconnection, which includes the steps of selecting at least one area including at least a portion of the interconnection, irradiating a laser beam or an electron beam to scan points of a matrix in the selected area without providing a supply voltage to the integrated circuit, and monitoring a current change at each of the points while the each of the points is being irradiated by the beam.

A method in a tenth aspect of the present invention is directed to detecting a physical defect in an interconnection, which includes the steps of irradiating a laser beam or an electron beam to scan points of a matrix in a subject region including at least a portion of the interconnection without providing a supply voltage to the integrated circuit, monitoring a current change at each of the points while the each of the points is being irradiated by the beam, and estimating the current change based on the magnitude thereof with respect to at least one threshold.

A method in an eleventh aspect of the present invention is directed to detecting a physical defect in an interconnection, which includes the steps of forming on the integrated circuit a film for absorbing a laser beam or electron beam, irradiating the laser beam or electron beam to scan points of a matrix in a subject region including at least a portion of the interconnection without providing a supply voltage to the integrated circuit, monitoring a current change at each of the points while the each of the points is being irradiated by the beam, and displaying the current change on a display panel.

The above and further objects as well as features and advantages of the present invention will be apparent from the following description of the preferred embodiments of the invention as illustrated in the accompanying drawings.

BRIEF DESCRIPTION OF THE DRAWINGS

FIG. 19A is a plan view showing a fourth application example of the fourth, fifth, eighth and ninth embodiment in accordance with the present invention;

FIG. 19B is an enlarged partial view of an interconnection portion in FIG. 19A;

FIG. 19C is an enlarged partial view of another interconnection portion in FIG. 19A.

FIG. 19D is a timing chart showing a signal waveform in the interconnection portion of FIG. 19B.

FIG. 19E is a timing chart showing a signal waveform in the interconnection portion of FIG. 19C.

FIG. 25A is a perspective view for showing the principle of the eighth embodiment in accordance with the present invention;

FIG. 25B is a plan view showing selected areas for irradiation of the beam shown in FIG. 25A;

DESCRIPTION OF THE PREFERRED EMBODIMENTS

An interconnection test method of a first embodiment in accordance with the present invention utilizes a known method referred to as an OBIRCH method (Optical Beam Induced Resistance Change) as used in a prior art to detect a defect in a metal line in a semiconductor integrated circuit test chip. This method is used in the present invention to estimate current and is modified to detect a defect in an interconnection of an actual semiconductor device chip.

Figure 1:
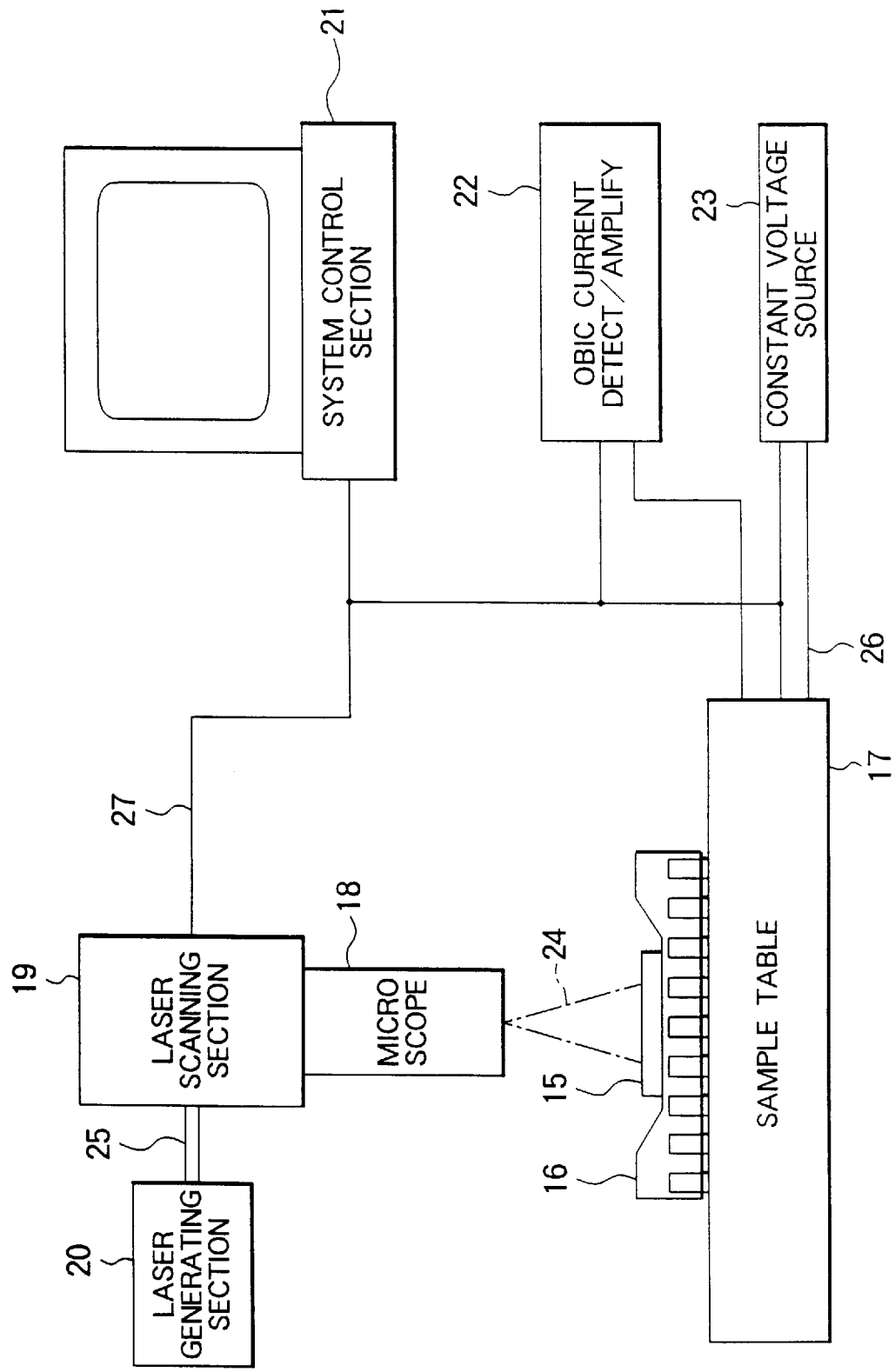
FIG. 1 is a block diagram showing an interconnection test system according to the principle of the present invention.

FIG. 1 shows an interconnection test system according to a first embodiment of the present invention. The method is also proposed in an earlier application, published on Oct. 28, 1994 as Patent Publication No. JP-A-6-300824. A laser beam 24 generated by a laser generating section 20 is irradiated and scanned by a laser scanning section 19 and a microscope 18 in a subject region of a semiconductor chip 15 on a package 16 mounted on a sample table 17. Synchronized with the laser scanning, a resistance change of a target interconnection is detected and amplified in the subject region by an OBIC current detecting/amplifying section 22, and displayed as a current change intensity distribution on a CRT by system control section 21 for controlling the system and implementing an image processing. Physical defects existing in the interconnection is observed while the interconnection is being irradiated by a radiation beam. In FIG. 1, numerals 25, 26 and 27 denote an optical transmission path, a current transmission path and a signal line, respectively. Electric power is supplied to the chip 15 from a power supply unit 23 implemented as a constant voltage source.

It is possible to monitor a defect in the interconnection by using the test system as described above, and it is also possible to observe whether the value of the current flowing in the interconnection is large or small, namely, to estimate the current in the interconnection. Its principle will be outlined with reference to FIG. 6. If a beam 1 is irradiated to an interconnection 2, a temperature (T) of the interconnection 2 rises to (T+ΔT), with the region irradiated by the beam 1 as a heat center. Thereby, the resistance R of the interconnection 2 is increased to resistance (R+ΔR) with the irradiated region as a resistance increasing center.

If a constant voltage is applied between both the ends of the interconnection 2, the current (I) is decreased to (I −ΔI). The current decrease (ΔI) is approximately proportional to an original current (I). Therefore, the current (I) can be known if a current decrease (ΔI) is estimated.

Interconnections 2 are generally distributed within the chip area of the integrated circuit, so that it is almost impossible to monitor the current flowing in the respective interconnections within the chip from the outside of the chip. However, it may be possible to monitor, from the outside of the chip, the current in the interconnection 2 to which the beam 1 is irradiated, by monitoring the decrease of the current.

Based on the principle mentioned above, it is possible to monitor the current in any of the interconnections. By monitoring the supply current, it is possible to identify the faulty portions, for which it was difficult or impossible to do by using only the conventional method.

If an active semiconductor layer including a p-n junction is not exposed in the subject region or not connected to any of the interconnections, as may be obtained in case of a test chip for TEG (Test Element Group) method, it is possible to monitor a BIRCH (Beam Induced Resistance Change, that is, a generic name of an OBIRCH, an EBIRCH and an IBIRCH in which an optical beam, an electron beam and an ion beam are used, respectively) image. In contrast, if the active semiconductor layer including, for example, a p-n junction is exposed in the subject region, it is difficult to separate the OBIRCH signal from an OBIC signal as obtained by using a laser beam, or to separate the EBIRCH signal from an EBIC signal as obtained by using an electron beam.

Figure 2:
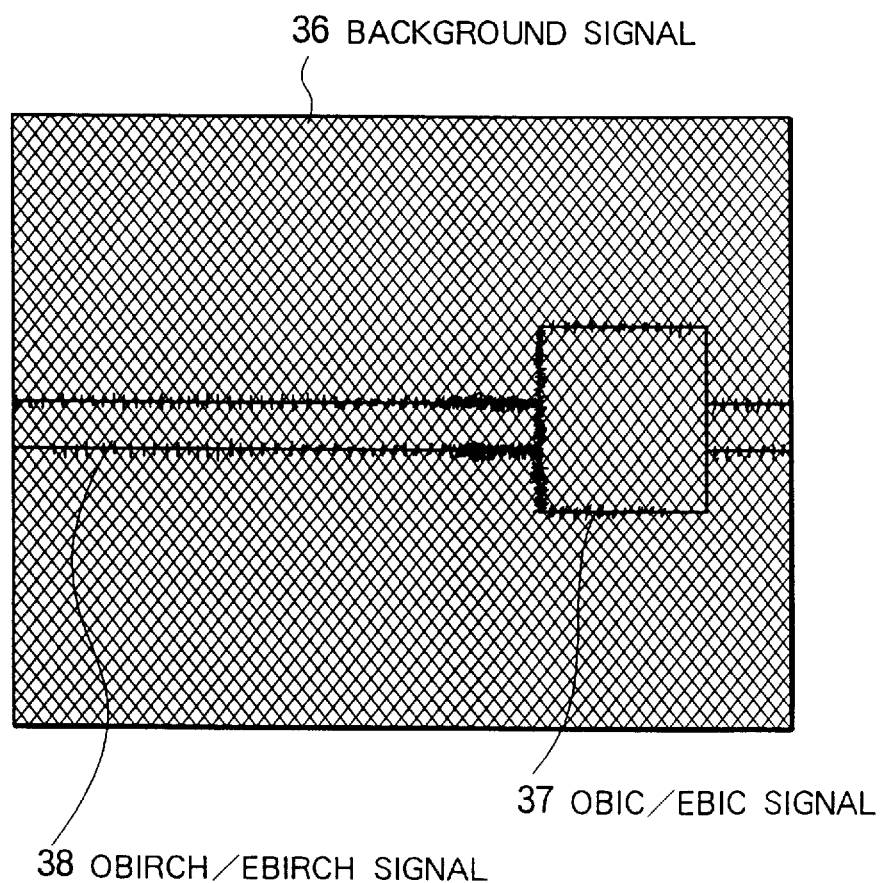
FIG. 2 is a plan view showing an OBIRCH/OBIC image or an EBIRCH/EBIC image obtained by the test system of FIG. 1.

FIG. 2 shows a signal distribution on a CRT in the test system as proposed by the present application. A background signal 36 generated in an area other than the interconnection on the chip is mixed with an OBIC/EBIC signal 37 and an OBIRCH/EBIRCH signal 38. Thereby, it is difficult to separate the OBIRCH/EBIRCH signal 38 from the OBIC/EBIC signal 37.

Figure 3:
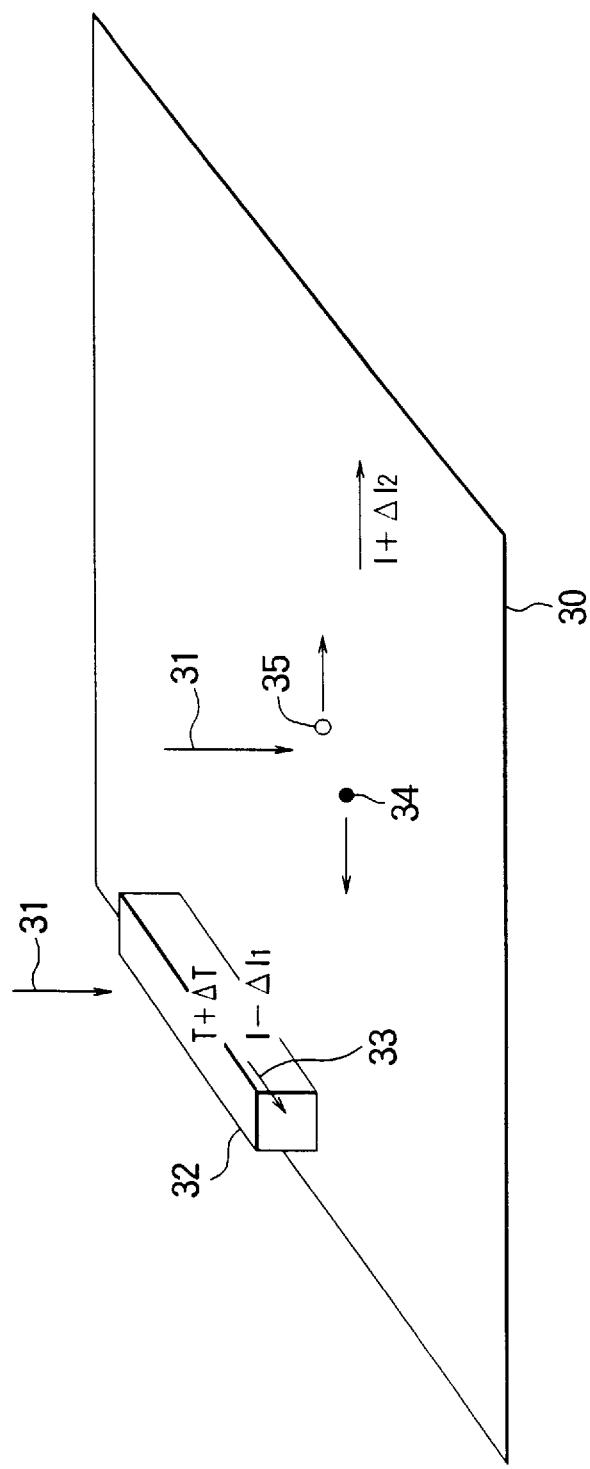
FIG. 3 is a perspective view for showing a principle of a fourth embodiment in accordance with the present invention.

It is possible, however, to use the fact that the OBIC/EBIC signal rises from the original current and that the BIRCH signal falls from the original current by irradiation of a radiation beam. The present invention utilizes this principle in order to separate those signals. FIG. 3 shows the principle of the test method in accordance with the present invention. When a laser beam or an electron beam (laser/electron beam) 31 is irradiated to a semiconductor active layer, pairs of an electron 34 and a hole 35 (electron-hole pairs) is generated in the semiconductor active layer of the chip 30 to provide a current ($\Delta I_2$). Thereby, the OBIC/EBIC signal rises from the original current (I) to an increased current (I+$\Delta I_2$).

On the other hand, when the laser/electron beam 31 is irradiated to an interconnection 32, the temperature (T) of the interconnection 32 rises to (T+ΔT) with the portion irradiated by the laser/electron beam 31 as a heat center, and resistance (R) of the interconnection 32 is increased to resistance (R+ΔR) with the irradiated portion as a resistance increasing center. Thereby, the BIRCH signal falls from the original current (I) to a decreased current (I−$\Delta I_1$).

As a result, it may be possible to clearly separate an OBIRCH image from an OBIC image, or an EBIRCH image from an EBIC image, by adding a process including the steps of storing in a memory a current change of the supply line for each of the irradiated points of the sample, displaying the current change in a histogram, specifying a threshold value of the current change on the histogram above or below the background signal, displaying on a display panel each of the points providing the current change on the lower side of a lower one of the thresholds to obtain a BIRCH image and displaying on the display panel each of the points providing the current change on the upper side of an upper one of the thresholds, so as to obtain an OBIC image or an EBIC image.

In the method as described above, electron-hole pairs are generated in the semiconductor active layer of the chip through an OBIC phenomenon or an EBIC phenomenon when a laser/electron beam is irradiated, to thereby provide current increase. As a result, the OBIC/EBIC image appears in a form as overlapped with the OBIRCH/EBIRCH image.

Figure 4A:
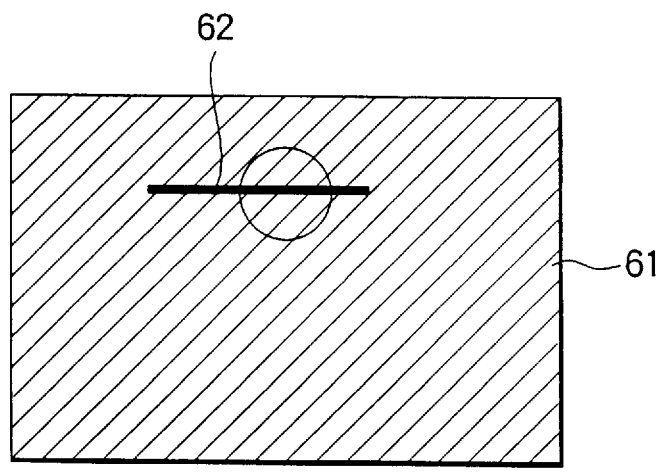
FIGS. 4A and 4B show the OBIRCH/OBIC image or the EBIRCH/EBIC image obtained by the test system of FIG. 1.
Figure 4B:
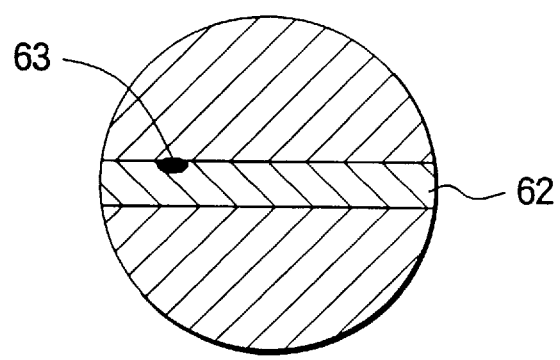

FIG. 4A shows the image on the display panel as described above while FIG. 4B shows a detail within a circle in FIG. 4A. In general, the OBIC/EBIC signal is stronger than the OBIRCH/EBIRCH signal. Thereby, the OBIRCH/EBIRCH image of an interconnection 62 can not be observed clearly if the OBIC/EBIC image appears on a chip 61. For the sake of understanding in FIGS. 4A and 4B, the OBIRCH/EBIRCH image is visibly illustrated. However, it is almost or perfectly invisible in an actual sample.

In case of a test chip for the TEG method, it is possible to connect interconnections so that the OBIC signal does not appear. However, it is impossible in general to obtain such a connection in an actual product. This is one of serious obstacles to an applicability of the OBIRCH/EBIRCH method in the prior art.

Recently, a fact is reported that the defect in an interconnection layer can be observed even in a non-bias state in case of the laser beam, in an Extended Abstracts for the 55th Autumn Meeting, 1994, The Japan Society of Applied Physics, by Koyama. et al. "Bias-free evaluation technique for Al interconnects with high sensitive OBIC" 586 (22a-ZP-10) published on Sep. 19, 1994. This phenomenon is believed to be caused by thermoelectric effect: laser beam heating causes the thermoelectric effect. This method referred to as NB-OBIC, therefore, can be applied using electron beam heating referred here to as NB-EBIC. The OBIC/EBIC image appearing in the NB-OBIC/NB-EBIC method is also an obstacle similar to the case as described above if the NB-OBIC/NB-EBIC image is to be observed. In the OBIRCH/EBIRCH method and in the NB-OBIC/NB-EBIC method, when the laser/electron beam is irradiated, all of energies thereof are not always efficiently used for the OBIRCH/EBIRCH phenomenon and NB-OBIC/NB-EBIC phenomenon. In case of the OBIRCH and NB-OBIC, 80% to 90% of a laser beam irradiated to the interconnection is reflected and only the remaining 10% to 20% is absorbed in the interconnection. Therefore, the proportion of the irradiated laser beam that contributes to the OBIRCH or NB-OBIC phenomenon ranges between 10% and 20%.

Further, in case of the EBIRCH and NB-EBIC, the electron beam irradiated to the interconnection is spread by scattering in both a row direction and a column direction in the sample. Namely, heat is generated throughout the spread region, so that an efficiency of the EBIRCH and NB-EBIC phenomenon may be reduced depending on the manner of spread.

In order to suppress the reflection of an irradiated laser beam, or in order to suppress the spread of an irradiated electron beam, a thin film for absorbing such an energy of the laser/electron beam may be formed on the chip. In this case, the OBIRCH/EBIRCH or NB-OBIC/NB-EBIC signal is stronger than the OBIC/EBIC signal, and the OBIRCH/EBIRCH or NB-OBIC/NB-EBIC signal can be observed more clearly.

Alternatively if the area of the interconnection is detected, and the laser/electron beam is irradiated to only a detected area of the interconnection, then the OBIRCH/EBIRCH or NB-OBIC/NB-EBIC signal can be stronger than OBIC/EBIC signal, and the OBIRCH/EBIRCH or NB-OBIC/NB-EBIC image can be observed more clearly.

Now, embodiments in accordance with the present invention will be described with reference to the attached figures.

Figure 5:
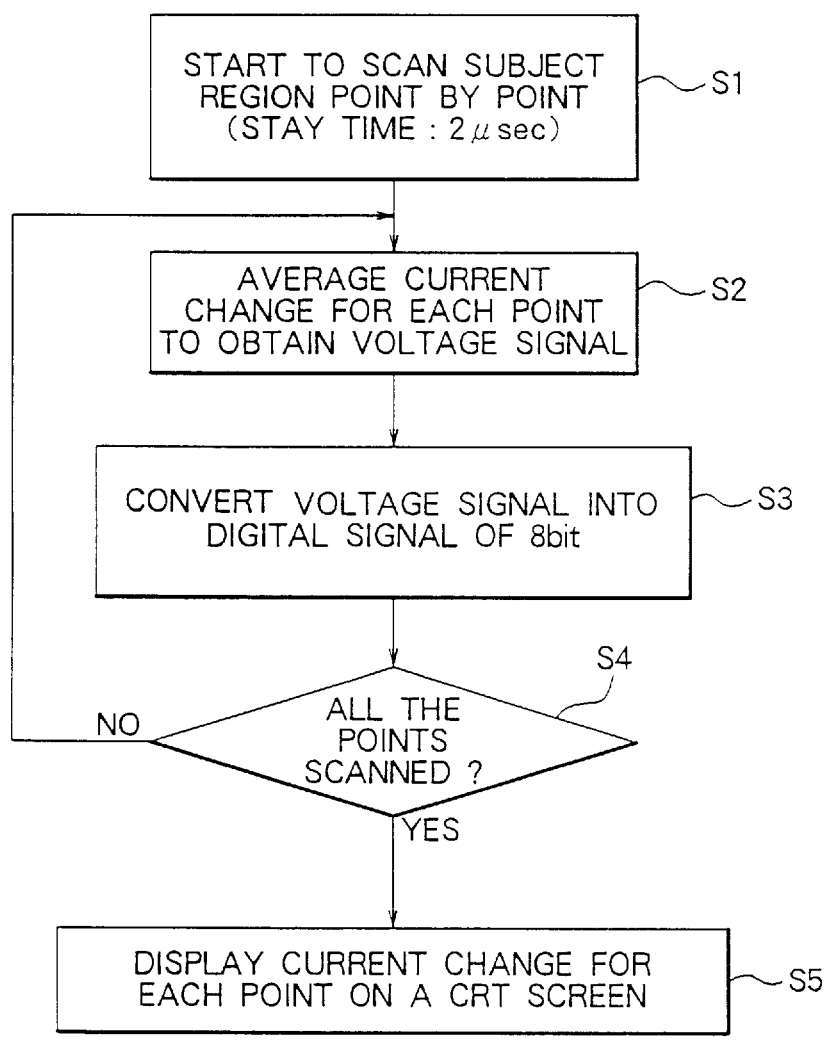
FIG. 5 is a flow chart showing a process of a first embodiment in accordance with the present invention.
Figure 6:
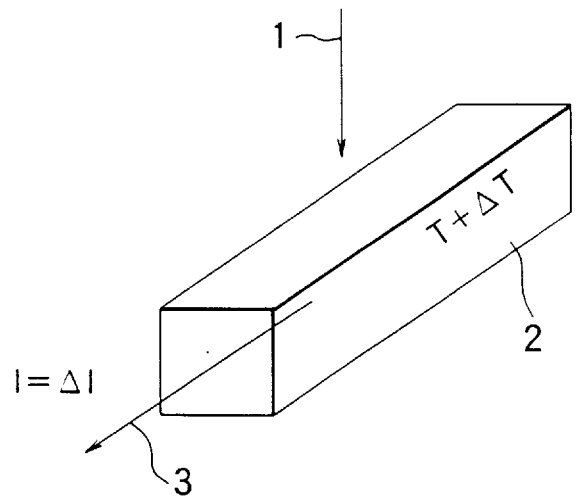
FIG. 6 is a perspective view for showing the principle of the first embodiment of the present invention.
Figure 7:
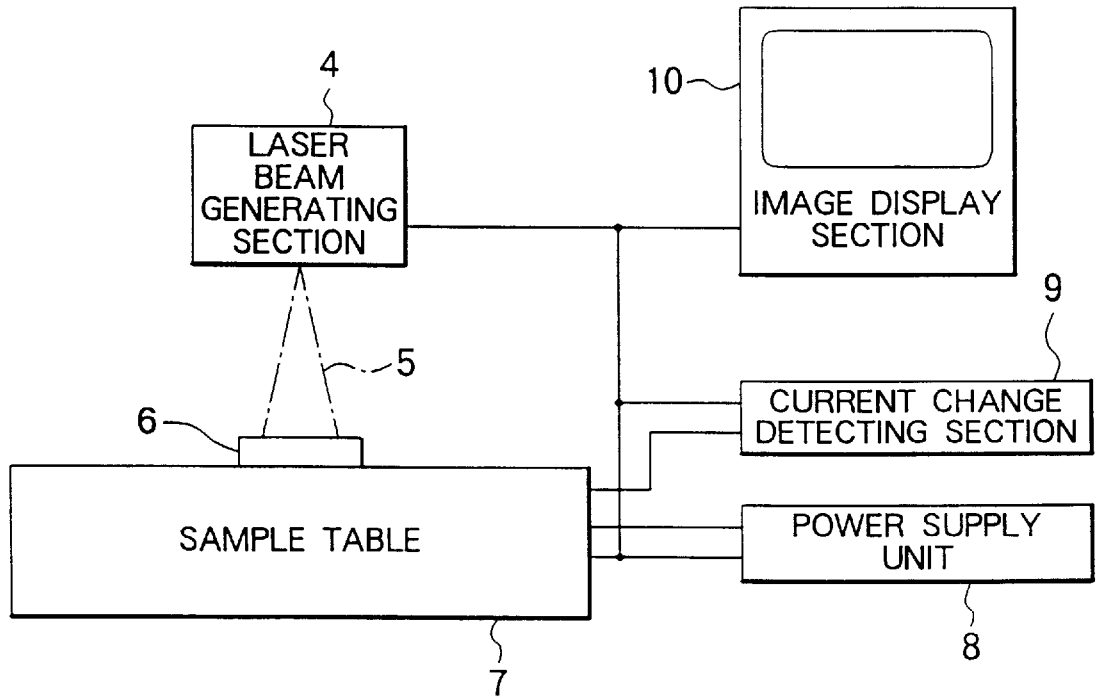
FIG. 7 is a block diagram showing the configuration of an interconnection test system implementing the first embodiment of the present invention.

Referring to FIGS. 5, 6 and 7, a first embodiment of the present invention will be described below. FIG. 5 shows the process of the first embodiment, FIG. 6 shows the principle of the first embodiment as mentioned before, and FIG. 7 shows the configuration of an interconnection test system implementing the first embodiment of the present invention.

In FIG. 7, the interconnection test system is comprised of a laser beam generating section 4 for generating a laser beam 5, a sample table 7 on which a sample 6 of an integrated circuit is placed, a power supply unit 8 for supplying a constant voltage, a current change detecting section 9 for detecting a current change in a supply line, and an image display section 10.

The sample table 7 can move in X axis direction, Y axis direction and Z axis direction. The sample 6 is placed on the sample table 7, which is moved to carry the sample 6 to an area irradiated by the laser beam 5. Thereafter, the electric power is supplied from the power supply unit 8 to the sample 6. The laser beam 5 generated by the laser beam generating section 4 is irradiated to a subject region of the sample 6 to be observed and including a target interconnection. The subject region of the sample 6 is scanned by the laser beam 5, while the electric power is supplied from the power supply unit 8 to the sample 6 by inputting a test pattern through an input terminal of the sample 6, thereby preparing a specified and desired quiescent conducting condition in the sample 6.

A He-Ne laser is used as the laser generating section 4 having a wave length of 633 nm, an output of 2 mW, and a beam diameter of about 0.4 micrometers ($\mu$m). Assuming that the subject region of the sample 6 is, for example, an area of 35 $\times$m$\times$35 $\mu$m, it takes about 0.5 second to scan the subject region by one scanning operation. The current change detecting section 9 detects the current change in the power supply line for each of the points in the subject region of the sample 6 while the subject region is being scanned digitally at the each of the points of a matrix of 512 columns by 512 rows. The image display section 10 converts the current change for each of the scanned points detected by the current change detecting section 9 into the intensity variation displayed as an intensity distribution on a CRT screen.

In order to detect the current change in the sample 6, the sample 6 is first moved by the sample table 7 such that the subject region of the sample 6 is placed within a scanning area of the laser beam 5. Thereafter, electric power is supplied from the power supply unit 8 to the sample 6.

Subsequently, the laser beam 5 is irradiated to the subject region of the sample 6, while the subject region is scanned point by point (Step S1). In this case, a stay time of the laser beam at each of the scanned points of the subject regions is 2 microseconds ($\mu$S). The current change detecting section 9 averages the detected current changes within the stay time and converts the averaged value into a voltage signal (Step S2).

The current change detecting section 9 carries out an A/D conversion of the voltage signal into a digital signal of 8 bits or 256 gradations and stores the same at a location of a memory (not shown) corresponding to coordinates of each of the scanned points (Step S3). If the scanning in the subject region has not been completed, the process from the step S2 to the step S4 is repeated.

If the scanning has been completed for the entire subject region of the sample 6, the image display section 10 reads out the voltage signal from the location of the memory corresponding to each of the scanned points in the subject region of the sample 6, converts the same into an intensity data or a pseudo color data and displays the data in a form of the 256 gradation sequence at each of the points on the CRT screen corresponding to each of the scanned points (Step S5). In this manner, it is possible to observe current flowing in the interconnections including both a normal interconnection and an abnormal interconnection of the integrated circuit.

In an existing technical level, it is possible to monitor the conductive or non-conductive state of the interconnection if a current density thereof is more than or equal to $4\times10^4$ A/cm$^2$. Also, it is theoretically possible to monitor the state of the interconnection even at the current density less than the value mentioned above. In an integrated circuit, the current density in the interconnection is less than or equal to an order of $1\times10^5$ A/cm$^2$ in general. Therefore, the test method of the present embodiment can be applied to actual integrated circuits in many cases.

Further, in case of the laser beam, there is no problem resulting from the charge-up, such as observed in an EB tester which detects a secondary electron emission by using an electron beam. Even if the interconnection is covered by an insulator film, it is not a significant obstacle against the monitoring. The conventional OBIC method is used to investigate conductive or non-conductive state of a target transistor, so that it can not be applied to the case where an upper part of the target transistor is covered by an interconnection metal layer.

On the other hand, it is the current of an interconnection that is monitored in the test method of the first embodiment in accordance with the present invention. Thereby, even if some parts of the interconnection is covered by an upper interconnection layer, there will be many cases in which a portion of the interconnection is exposed so that the present invention can be applied. That is, there is a less probability that an entire interconnection is covered by other upper interconnection layers. Further, in a multi-level interconnection structure, it is possible to observe all layers of the multi-level interconnection at a time, by digitally storing an image data for each layer on which the laser beam is focused and scanned, and then displaying a sum of the image data in which a plurality of those stored image data are added digitally in the subject region.

Whether the current change for each of the scanned portions mentioned above exhibits a normal state or an abnormal state in the interconnection can be judged by comparing the current change of a normal product or a normal portion of an interconnection with that of the abnormal interconnection. For example, a process will be described hereinafter where it is found that the sample 6 requires more power supply current than that of a normal product and it is supposed that an abnormal path is formed in some portion of the sample 6.

It may take too long time to monitor an entire area (about a square of 10 mm) of the sample chip 6. Thereby, it is preferable to monitor only a supposed faulty portion. If it is supposed that there is an abnormal path on the sample 6 such as mentioned above, it is enough to scan the subject region including the supposed faulty portion and monitor only the interconnection for the power supply line and other interconnections connected directly thereto.

First, a power supply voltage of 5 V is applied to the sample 6 to which a laser beam 5 is being irradiated. An OBIRCH image of the sample 6 is then obtained through processing by the current change detecting section 9 and the image display section 10. The field of the OBIRCH image should be limited, for example, to a square area of about 500 μm even at a minimum magnification because it is generally difficult to identify the interconnection if the magnification is too low.

Then, a portion on the sample 6 is investigated wherein the OBIRCH image can be observed. That is, the portion wherein the current is flowing and the OBIRCH image can be detected. If the portion is found wherein the OBIRCH image is visible, the OBIRCH image is read and stored into the memory.

Subsequently, the OBIRCH image at the similar portion at the similar condition of a normal product which is of the same type as the sample 6 is read and stored into the memory. Difference between the OBIRCH image of the sample 6 and the OBIRCH image of the normal product is estimated and displayed on the CRT screen of the image display section 10. Thus, it is possible for the operator to read out the interconnection wherein the abnormal current flows from the contents displayed on the CRT screen.

In the process as mentioned above, the abnormal portion of the sample 6 is determined by using the abnormal OBIRCH image as compared with that of the normal product. However, it is also possible to use a normal OBIRCH image obtained from another portion of the same sample 6, which is designed identical to the target portion of the sample 6 and which is already confirmed to be normal, so as to detect the abnormal portion similarly to the process as mentioned above.

Figure 8:
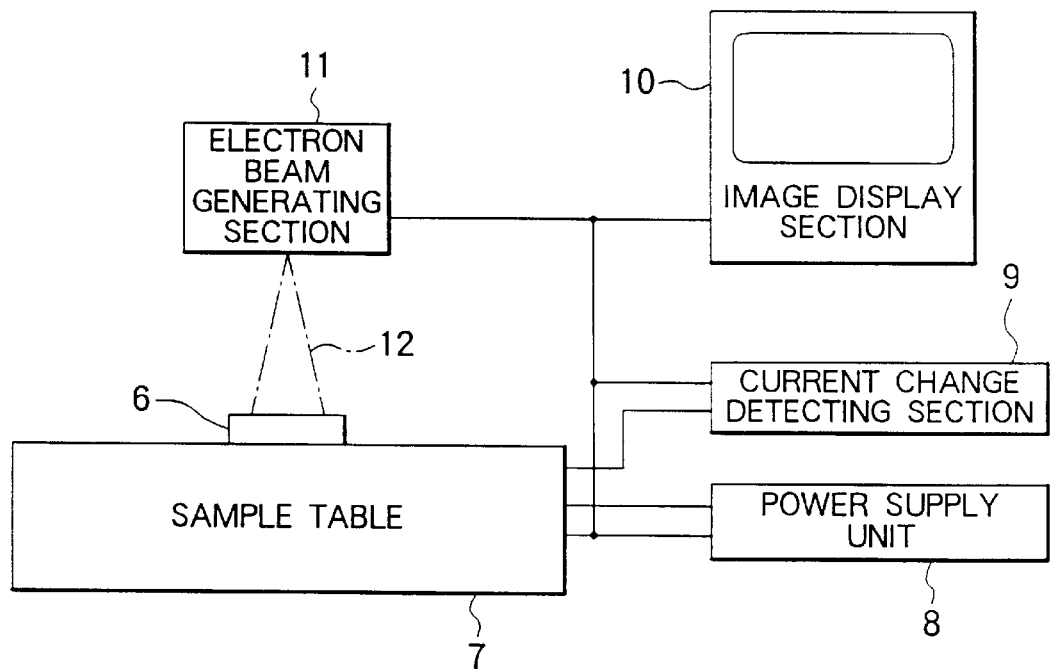
FIG. 8 is a block diagram showing the configuration of an interconnection test system implementing a second embodiment of the present invention.

FIG. 8 shows the configuration of an interconnection test system of a second embodiment in accordance with the present invention. The present embodiment has a configuration similar to that of the first embodiment shown in FIG. 7, except that an electron beam 12 is generated by an electron beam generating section 11 instead of the laser beam 5. Similar constituent elements are designated by common reference numerals between FIGS. 7 and 8 and throughout the drawings.

For the electron beam 12, the condition thereof can be varied in a large variety and with ease, as compared with the laser beam 5. For example, the electron beam generating section 11 generates an electron beam generated by an accelerating voltage of 10 KV and having a beam current of 2 nA and a beam diameter of about 0.1 μm. Assuming that the subject region of the sample 6 ranges, for example, an area of 35 μm×35 μm, it takes about 0.5 second to scan the region by one scanning operation.

The current change detecting section 9 detects the current change for each of the points of a matrix of 512 columns by 512 rows in the subject region while the subject region is being scanned digitally at the each of the points. The image display section 10 converts the current change detected by the current change detecting section 9 for each of the scanned points into the intensity variation displayed as an intensity distribution on the CRT screen.

In the second embodiment, an electron beam 12 is used as the radiation beam for the sample 6. However, contrary to the EB tester, in this embodiment, secondary electrons are not detected, and the current change in the interconnection is monitored while the electron beam is irradiated. Accordingly, there is scarcely a problem resulting from a so-called charge-up. Even if the interconnection is covered by an insulator film, it is not a significant obstacle against the monitoring.

Figure 9:
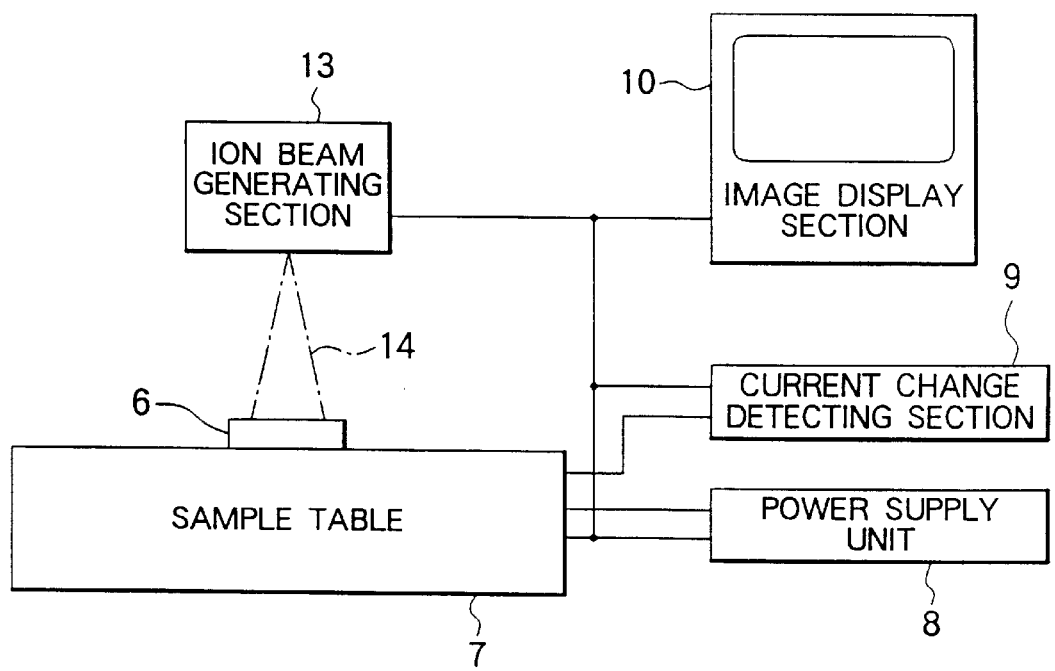
FIG. 9 is a block diagram showing the configuration of an interconnection test system implementing a third embodiment of the present invention.

FIG. 9 shows an interconnection test system of a third embodiment in accordance with the present invention. In the drawing, the present embodiment has a configuration similar to that of the first embodiment shown in FIG. 7, except that an ion beam 14 is generated by an ion beam generating section 13 instead of the laser beam 5.

For the ion beam 14, the condition thereof can be varied in a large variety and with ease, similarly to the electron beam 12 and contrary to the laser beam 5. For example, the ion beam generating section 13 generates an ion beam 14 generated by an accelerating voltage of 30 KV and having a beam current of 30 pA and a beam diameter of about 0.1 μm. Assuming that the subject region of the sample 6 ranges, for example, an area of 35 μm×35 μm, it takes about 0.5 second to scan the whole region by one scanning operation.

The current change detecting section 9 detects the current change for each of the points of a matrix of 512 columns by 512 rows when the subject region of the sample 6 is scanned digitally at each of the points. The image display section 10 converts the current change at each of the scanned points detected by the current change detecting section 9 into the intensity variation displayed as an intensity distribution on the CRT screen.

An ion beam 14 may destructively act against the sample 6, unlike a laser beam 5 or an electron beam 12. That is, etching is proceeded during the scanning at the portion irradiated by the ion beam 14. However, the etching rate is small, such as about 0.01 nm/second, under the condition mentioned above. Thereby, deficiency caused by the etching and generated during the monitoring can be almost ignored.

In the third embodiment, an ion beam 14, i.e., a charged particle is used as the radiation beam for the sample 6. However, contrary to the EB tester, secondary electrons are not detected and the current change in the interconnection is monitored while the ion beam is irradiated. Accordingly, there is scarcely a problem resulting from a so-called charge-up. Then, even if the interconnection is covered by the insulator film, it is not a significant obstacle against the monitoring.

Figure 10:
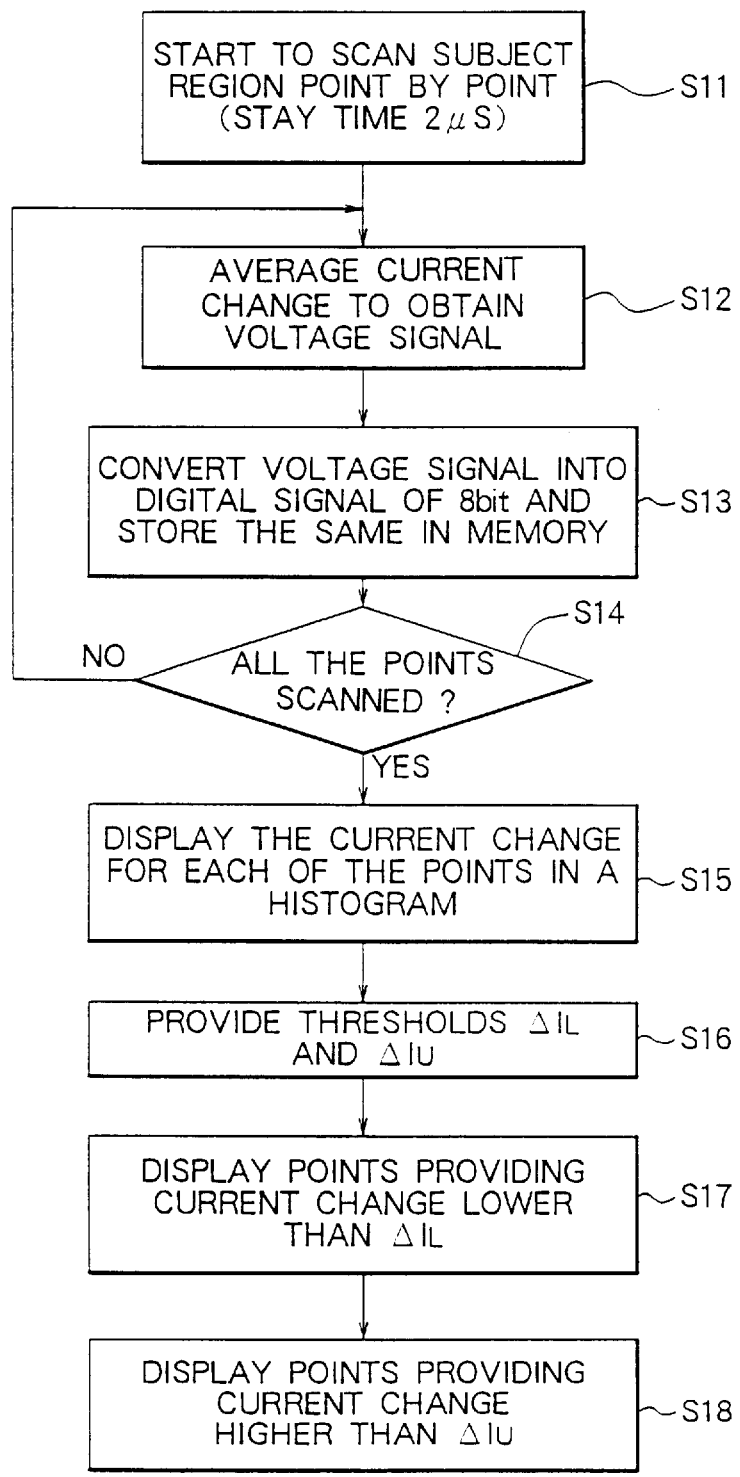
FIG. 10 is a flow chart showing a process of a fourth embodiment in accordance with present invention.
Figure 11A:
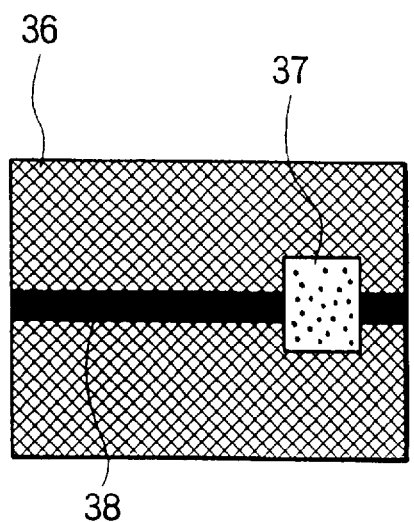
FIG. 11A is a plan view showing an image example in which an OBIRCH/EBIRCH signal and an OBIC/EBIC signal are separated according to the fourth embodiment of the present invention.
Figure 11B:
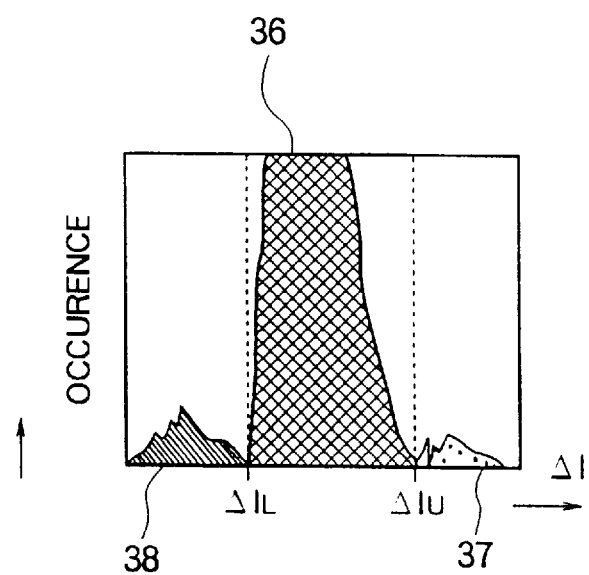
FIG. 11B is a histogram showing the result of the current change used to obtain the image example of FIG. 11A according to the fourth embodiment of the present invention.

FIG. 10 shows a process of the fourth embodiment in accordance with the present invention, while FIG. 3 shows the principle of the fourth embodiment. FIGS. 11A and 11B show an example of the OBIRCH/EBIRCH images on a display section in the present embodiment.

In detail, FIG. 11A shows an OBIRCH/EBIRCH signal 38, an OBIC/EBIC signal 37 and a background signal 36 wherein they are separated from each other according to the present embodiment, while FIG. 11B is a histogram showing the detected results of the current change.

Now, a conductive test or monitoring the current in the interconnection for the integrated circuit (sample 6) according to the fourth embodiment will be described with reference to FIGS. 3, 10, 11A and 11B. Here, the configuration of the test system may be any of the configurations shown in FIGS. 7 and 8.

When a conductive test for the sample 6 is to be carried out to estimate current in the interconnection, the sample 6 is first moved by the sample table 7 such that the subject region of the sample 6 is placed within the scanning range of the laser/electron beam. Thereafter, the electric power is supplied from the power supply unit 8 to the sample 6.

Subsequently, the laser/electron beam is irradiated to the subject region of the sample 6, and the subject region is scanned point by point, i.e, digitally (Step S11). In this case, the stay time of the laser beam at each of the scanned points of the subject regions is 2 $\mu$S. The current change detecting section 9 detects the current changes in a power supply line, averages the detected current changes within the stay time, and converts the averaged value into a voltage signal (Step S12).

The current change detecting section 9 carries out an A/D conversion of the voltage signal into a digital signal of 8 bits or 256 gradations and stores the same at the location of the memory corresponding to the coordinates at each of the scanned points (Step S13). If the scanning in the subject region has not been completed, the process from the step S12 to the step S14 is repeated.

After a scanning operation has been completed, the image display section 10 reads out the voltage signal stored in the memory, converts the voltage value back into the current change value, estimates the same for every current change thereof and displays the same, in a form of a histogram on the CRT screen as shown in FIG. 11B, for the current change at each of the scanned points in the subject region of the sample 6 (Step S15). In FIG. 11B, the abscissa is the amount of current change ΔI monitored by the current change detecting section, while the ordinate is the number of the scanned points, i.e, the frequency of occurrence that shows the current change ΔI.

When an operator, while observing the histogram displayed on the CRT screen, specifies a lower threshold $\Delta I_L$ and an upper threshold $\Delta I_u$, the image display section 10 operates accordingly and displays the lower threshold $\Delta I_L$ and the upper threshold $\Delta I_u$ on the CRT screen (Step S16). As shown in FIG. 11B, there is a central plateau of a histogram portion for the background signal 36 between a current increase histogram portion for the OBIC/EBIC signal 37 and a current decrease histogram portion for the OBIRCH/EBIRCH signal 38. Thereby, the lower threshold $\Delta I_L$ and the upper threshold $\Delta I_u$ can be estimated with a relative ease at the minimum points between the maximal points of the histogram.

After the lower threshold and the upper threshold are determined, the image display section 10 displays the image of the current change on the CRT screen, at each of the scanned points corresponding to the current decrease appearing on the lower side of the lower threshold $\Delta I_L$ in the histogram (Step S17). In detail, the image display section 10 reads out the voltage signal stored in the memory corresponding to each of the scanned points mentioned above, converts the same into the intensity data or the pseudo color data and displays the same in the form of 256 gradations at each of the points on the CRT screen corresponding to each of the scanned points, which constitute the OBIRCH/EBIRCH signal 38 in FIG. 11A.

Subsequently, the image display section 10 displays the image of the current change on the CRT screen at each of the scanned points corresponding to the current increase appearing on the upper side of the upper threshold $\Delta I_u$ in the histogram (Step S18). In detail, the image display section 10 reads out the voltage signal stored in the memory corresponding to each of the scanned points mentioned above, converts the same into the intensity data or the pseudo color data and displays the same in the form of the 256 gradations at each of the points on the CRT screen corresponding to each of the scanned points, which constitute the OBIC/EBIC signal 37 in FIG. 11A.

Thereafter, the image display section displays the image of the current change on the CRT screen at each of the scanned points corresponding to the current change between the lower threshold $\Delta I_L$ and the upper threshold $\Delta I_u$, that is, the scanned points providing substantially no current change and constituting the background signal, to thereby end the process. Also in this case, the voltage signal stored in the memory corresponding to each of the scanned points is read out, converted into the intensity data or the pseudo data and displayed in the form of the 256 gradations at each of the points on the CRT screen corresponding to each of the scanned points, which correspond to the background signal 36 in FIG. 11A. Accordingly, the background signal 36 and the OBIC/EBIC signal 37 and the OBIRCH/EBIRCH signal 38 are displayed on the CRT screen in the image display section 10 wherein they are separated from each other by degradation. Alternatively, they may be separated from each other by colors. These images are easily recognized on the display panel because of the local existences thereof.

Figure 12A:
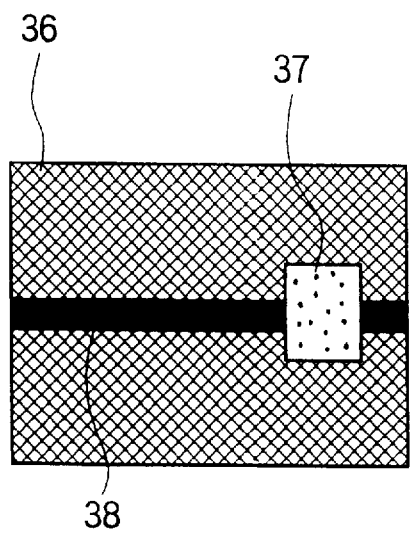
FIG. 12A is a plan view showing another image example in which the OBIRCH/EBIRCH signal and the OBIC/EBIC signal are separated according to the fourth embodiment of the present invention.
Figure 12B:
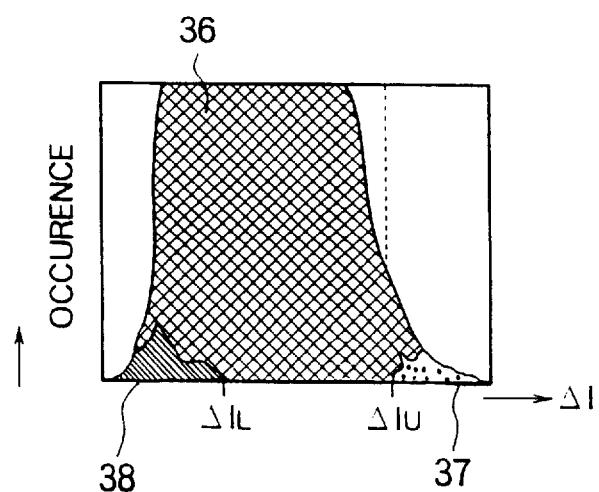
FIG. 12B is a histogram showing the result of the current change to obtain the image example of FIG. 12A according to the fourth embodiment of the present invention.

FIGS. 12A and 12B show another example of the OBIRCH/EBIRCH image as obtained according to the fourth embodiment of the present invention. FIG. 12A shows an OBIRCH/EBIRCH signal 38 and the OBIC/EBIC signal 37 wherein they are separated from the background signal 36 and from each other. FIG. 12B shows the detected results of the current change in a form of a histogram.

FIGS. 12A and 12B show an example such that both lower skirts of a central plateau of the histogram portion corresponding to the background signal 36 shown between the current increase histogram portion for the OBIC/EBIC signal 37 and the current decrease histogram portion for the OBIRCH/EBIRCH signal 38 extend horizontally and that both the skirts veil or overlap with the current increase histogram portion for the OBIC/EBIC signal 37 and the current decrease histogram portion for the OBIRCH/EBIRCH signal 38. The situation of the example is likely to occur if S/N (signal to noise ratio) in a current change detecting section is low while the amount of the current change ΔI is small. In this example, however, a signal separation can be obtained, if the specifying of the lower threshold $\Delta I_L$ and the upper threshold $\Delta I_u$ is performed within the lower skirts of the plateau, by a trial and error manner, such that a shape or profile of the interconnection and the transistor can be seen in the image in FIG. 12A as clearly as possible. In FIG. 12A, the resultant image are shown which are separated clearly by the specifying of the thresholds.

In FIG. 12B, the histogram portion on the left side of the lower threshold $\Delta I_L$ includes a first histogram portion of the scanned points corresponding to the current decrease due to the OBIRCH/EBIRCH and a second histogram portion of the background signal 36 overlapping with the first histogram portion. Further, the histogram portion on the right side of the upper threshold $\Delta I_u$ includes a third histogram portion of the scanned points corresponding to the current increase due to the OBIC/EBIC and a fourth histogram portion of the background signal 36 overlapping with the third histogram portion.

Figure 13:
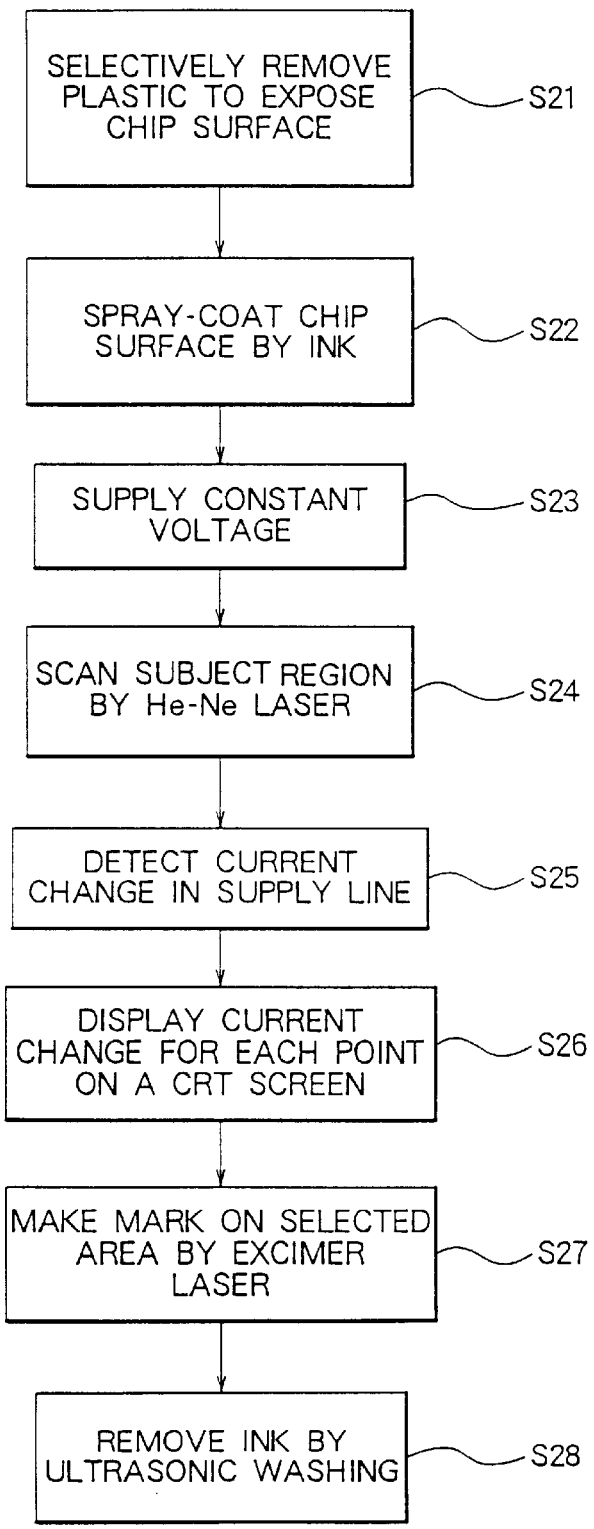
FIG. 13 is a flow chart showing a process of a fifth embodiment in accordance with the present invention.
Figure 14:
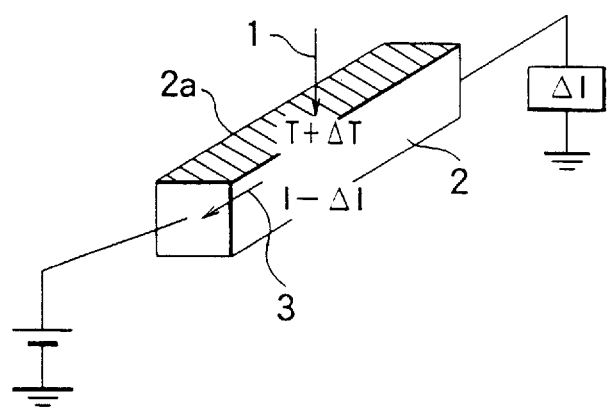
FIG. 14 is a perspective view for showing the principle of the fifth embodiment in accordance with the present invention.
Figure 15:
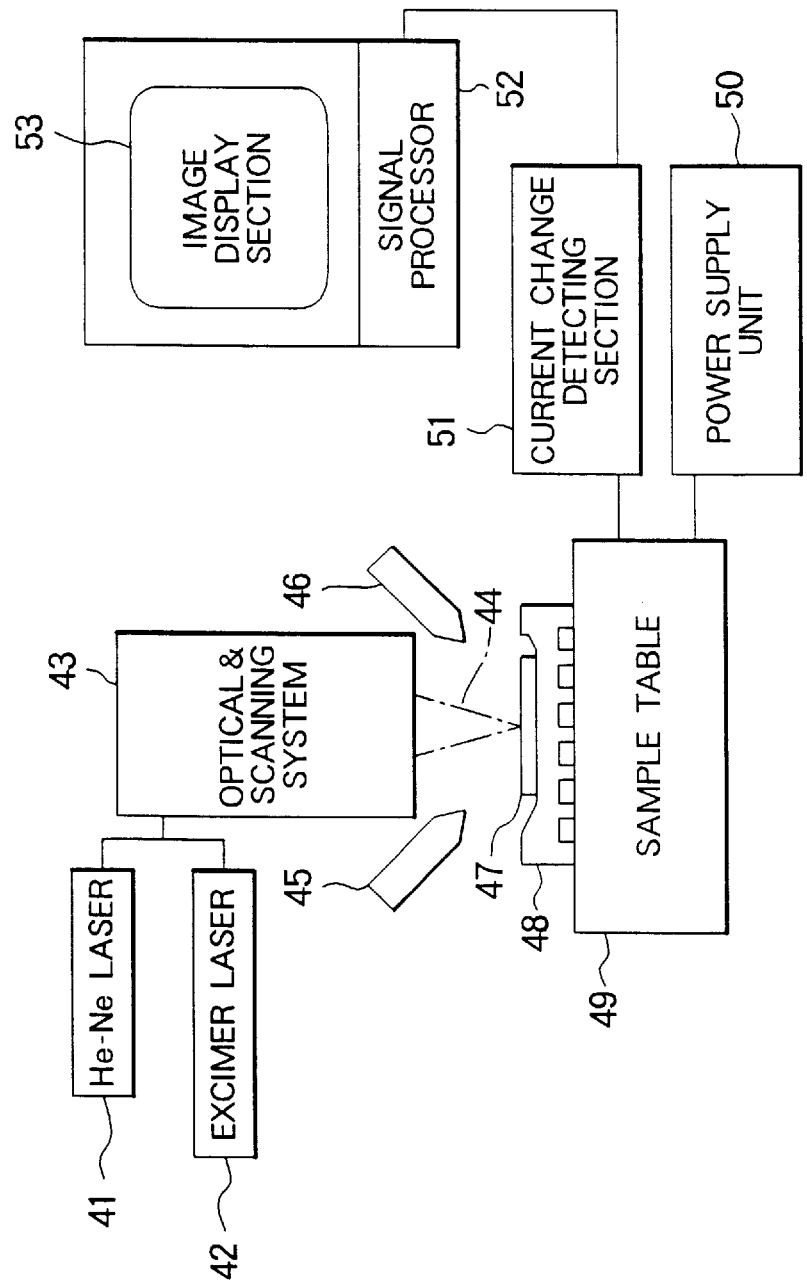
FIG. 15 is a block diagram showing the configuration of an interconnection test system implementing the fifth embodiment in accordance with the present invention.

FIG. 13 shows the process of a fifth embodiment in accordance with the present invention, while FIG. 14 shows the principle of the present embodiment. FIG. 15 shows the configuration of an interconnection test system implementing the present embodiment.

In FIG. 14, a thin film 2a having a low reflection coefficient for the beam 1, that is, having a high absorption rate to the beam 1 is formed on the surface of the interconnection 2 by coating or the like. By utilizing this configuration, it is possible to effectively use the energy of the beam 1 in the OBIRCH/EBIRCH phenomenon.

If a laser beam, i.e., a visible light beam is to be used as the beam 1, it is preferable to make the reflection coefficient for the beam 1 lower, in other words, to make the absorption rate higher, by making the thin film 2a black. Methods for making the thin film 2a black includes depositing a carbon, spraying a paint containing a carbon black, applying a black ink by a brush, and so forth.

It should be avoided to form a black film on the entire surface of the chip on which the interconnection 2 is arranged, or otherwise, it is difficult to identify the location on the chip. It should be also avoided to make the black film on the chip in a form of a gird, or to form the black film covering a reference point enabling navigation for the chip by CAD. It is preferable to make a reference mark by a laser so as to enable identification of the location on the chip after the black film is removed. Methods for forming the black film selectively on the chip includes performing a carbon adhesion by means of a FIB assist chip, and forming the thin film after covering the chip by a photo resist pattern, and so forth.

If an electron beam is to be used as the beam 1, an optimum condition should be selected based on an acceleration voltage for the electron beam, the material of the thin film 2a to be formed, or the thickness of the thin film 2a. The film quality, the film thickness, or the acceleration voltage may be determined experimentally for a specified beam.

In FIG. 14, after the beam 1 is irradiated to the thin film 2a on the interconnection 2, the temperature (T) of the interconnection 2 rises to (T+ΔT) with the irradiated portion of the beam 1 as a heat center, and thereby the resistance (R) of the interconnection 2 is increased to (R+ΔR) with the irradiated portion as a resistance increasing center.

If a constant voltage is applied across the interconnection 2 as shown in FIG. 14, the current (I) is decreased to (I−ΔI) by the irradiation. The amount (ΔI) of decrease is approximately proportional to the current (I) flowing originally in the interconnection, i.e., $$\Delta I \propto \Delta R \times I.$$

Accordingly, the current (I) can be determined if the decrease (ΔI) in the current is measured.

The interconnections 2 are distributed within the chip of the integrated circuit. Here, it is possible to determine, even from the outside of the chip, the current change in each of the interconnections 2 while the beam 1 is being irradiated thereto, by monitoring the decreased amount of the current. Thereby, it is impossible in the present invention to determine, from the outside of the chip, the currents flowing in the respective interconnections within the chip.

In accordance with the principle mentioned above, the present embodiment employs monitoring the current in the supply line supplying any of the interconnections in the chip. Further, by monitoring the current of the interconnections on the IC chip, it is possible to identify faulty portions for which it was difficult or impossible to do by using only the conventional method. Especially, in the fifth embodiment of the present invention, the energy of the beam 1 can be used effectively in the OBIRCH/EBIRCH phenomenon because of the film 2a so that the current can be monitored more effectively. At that time, the thin film 2a formed also on semiconductor active layer absorbs the beam 1 and preventing the beam 1 from reaching the semiconductor active layer. In this manner, the OBIC/EBIC phenomenon does not occur in the semiconductor active layer.

Referring to FIG. 15, the interconnection test system is comprised of a He-Ne laser 41, an excimer laser 42, an optical and scanning system 43, an ink spray section 45, a spray type washing section 46, a sample table 49 on which an IC package 48 including an IC chip 47 is placed, a power supply unit 50, a current change detecting section 51, a signal processor 52 and an image display section 53.

In operation, the sample table 49 can move in more than one of X axis direction, Y axis direction and Z axis direction. IN the IC package 48, a plastic material covering the upper surface of the IC chip is selectively removed by melting using a fuming nitric acid and the like to expose the surface of the IC chip 47. The IC package 48 is placed on the sample table 49, which is moved to carry the IC chip 47 to the area irradiated by the laser beam 44 (Step S21).

Thereafter, a Chinese ink is applied to a predetermined area of the surface of the IC chip 47 by the ink spray section 45 (Step S22). Then, the electric power is supplied from the power supply unit 50 to the IC chip 47 (Step S23). The electric power is supplied together with inputting a test pattern from the input terminal of the IC chip 47 to keep the IC chip 47 in a specified quiescent state of conducting. Under this state, a laser beam 44 generated by the He-Ne laser 41 is irradiated to the subject region to be observed on the IC chip 47. The subject region is then scanned by the laser beam 44 (Step S24).

The current change detecting section 51 detects the change in the current from the power supply unit to the IC chip 47 (Step S25). That is, the current change detecting section 51 detects the current change while each of the points in the subject region of the IC chip 47 is being scanned digitally or in a point by point manner. The signal processor 52 converts the current change in the supply line for each of the scanned points detected by the current change detecting section 51 into the intensity variation, and displays the same as an intensity distribution on the CRT screen of the image display section 53 (Step S26). In this case, the current change detected by the current change detecting section 51 may be converted into the pseudo color data to be displayed on the CRT screen of the image display section 53.

After the current change for each of the scanned points of the IC chip 47 is displayed on the CRT screen of the image display section 53, a mark is provided by the laser beam 44 generated from the excimer laser 42. The mark is provided on a desired portion of the IC chip 47 corresponding to a data specified from the outside by the operator based on the content displayed on the CRT screen (Step S27). Thereafter, the Chinese ink sprayed on the IC chip 47 is removed by the spray type washing section 46, for example, using an ultrasonic cleaning process (Step S28).

Figure 16A:
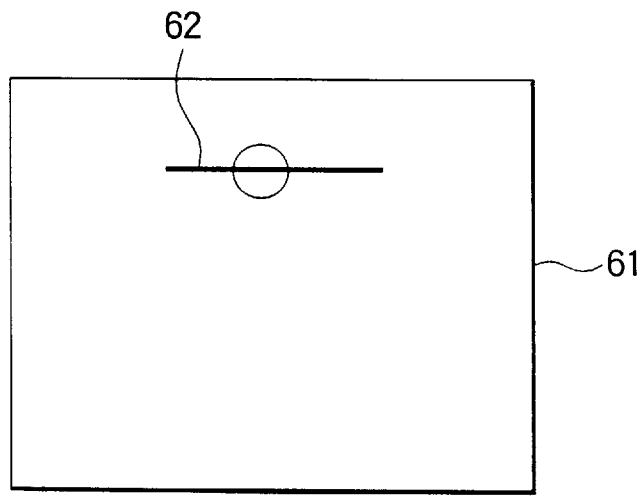
FIG. 16A is a plan view showing a first application example of the fourth, fifth, eighth and ninth embodiment in accordance with the present invention.
Figure 16B:
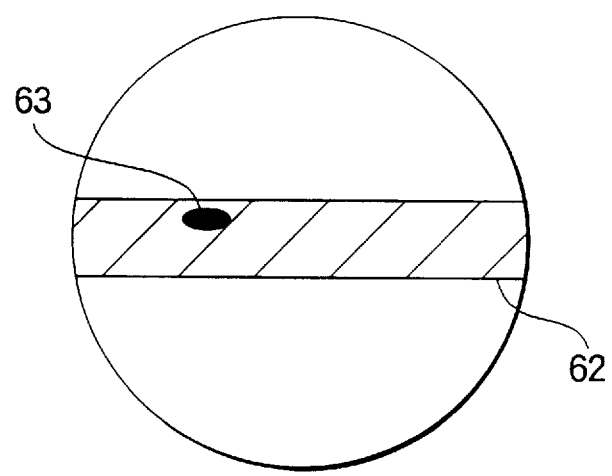
FIG. 16B is an enlarged partial view of an interconnection portion in FIG. 16A.

FIG. 16A shows a result obtained by a first application example of the fifth embodiment in accordance with the present invention. FIG. 16B is the enlarged view of a circle encompassing the interconnection portion encircled in FIG. 16A. These figures show an example of a detected void/Si nodule 63 in an interconnection 62 on a chip 61 generated due to a stress migration, an electromigration and the like, during a manufacturing process, during a test process or in use of the semiconductor IC.

Such a void/Si nodule 63 in the interconnection 62 can be detected by using a test chip for TEG technology, as described in Extended Abstracts for the 41th Spring Meeting, 1994, The Japan Society of Applied Physics, "Novel Al stripe voids detection technique using optical beam induced resistance change: OBIRCH(2)" pp629, (28p-ZH-13), by Nikawa et al., published on Mar. 28, 1994, and in Publication No. JP-A-6-300824 as mentioned before. However, it is generally impossible in the proposed method to detect the void/Si nodule 63 in an actual product or manufactured chip 61.

On the other hand, in the fifth embodiment, a thin film having a characteristic of absorbing an irradiated beam is formed on the surface of the manufactured chip 61 so as to use the energy of the radiation beam more effectively in the OBIRCH/EBIRCH phenomenon. In addition, the OBIC/EBIC phenomenon in the semiconductor active layer is suppressed by the thin film formed on the silicon surface of the chip 61. Thereby, as shown in FIG. 16B, the test system can detect the void/Si nodule 63 in the interconnection 62 with a high sensitivity.

Figure 17A:
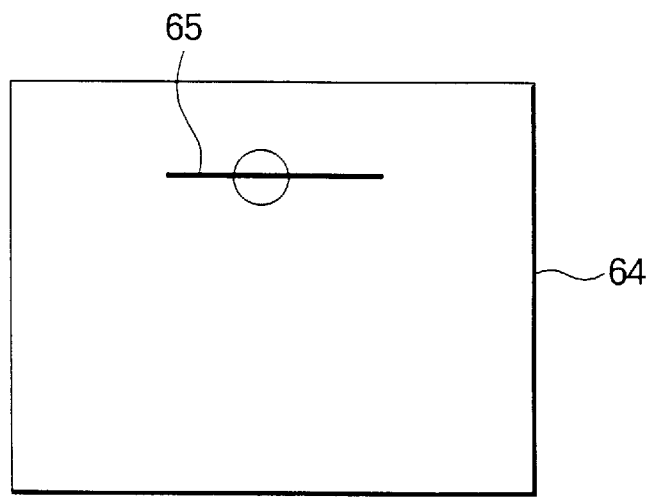
FIG. 17A is a plan view showing a second application example of the fourth, fifth, eighth and ninth embodiment in accordance with the present invention.
Figure 17B:
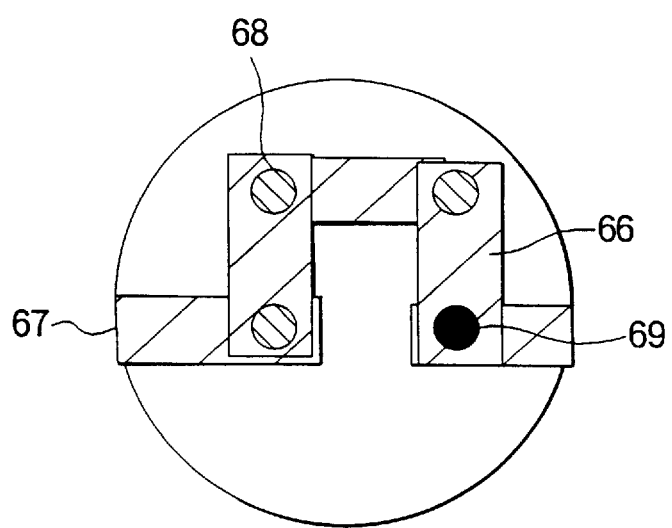
FIG. 17B is an enlarged partial view of an interconnection portion in FIG. 17A.

FIG. 17A shows a result obtained by a second application example of the fifth embodiment. FIG. 17B is the enlarged view of the interconnection portion encircled in FIG. 17A. These figures show the detected example of a defect in a via 69 connecting an upper layer interconnection 66 and a lower layer interconnection 67 of an IC chip 64 having a multilevel interconnection structure.

In this example, a thin film having the characteristic of absorbing a radiation beam is formed on the surface of the chip 64 having a multi-level interconnection structure 65 so as to effectively use the energy of the radiation beam in the OBIRCH/EBIRCH phenomenon as well as to suppress the OBIC/EBIC phenomenon in the active layer by the thin film on the silicon surface of the chip 64. Thereby, as shown in FIG. 17B, it is possible to make clear the difference between the contrasts of the OBIRCH/EBIRCH images of each of a normal via 68 and of an abnormal via 69 Accordingly, it is possible to detect the interconnection defect in the via connecting between the layers on the manufactured IC chip 64 and the structural abnormality with a high sensitivity.

Figure 18A:
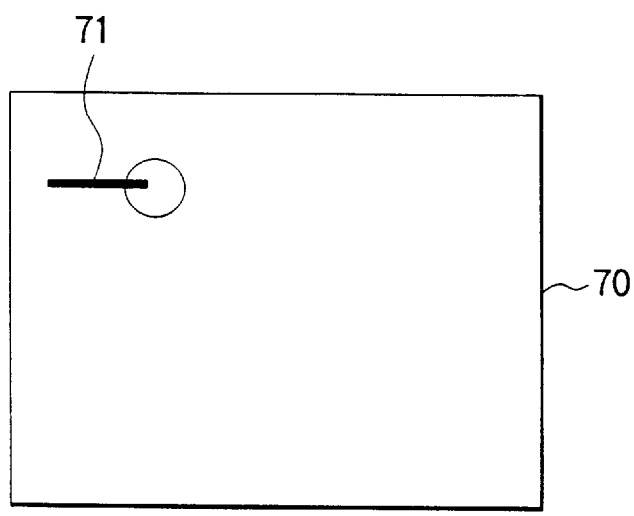
FIG. 18A is a plan view showing a third application example of the fourth, fifth, eight and ninth embodiment in accordance with the present invention.
Figure 18B:
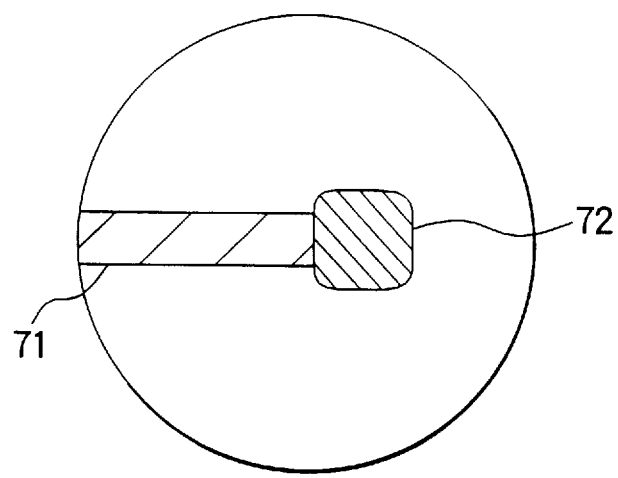
FIG. 18B is an enlarged partial view of an interconnection portion in FIG. 18A.

FIG. 18A shows a result obtained by a third application example of the fifth embodiment. FIG. 18B is the enlarged view of the interconnection portion encircled in FIG. 18A. These figures illustrate the example in which the OBIRCH/EBIRCH method is used in order to find out a defect in the interconnection 71 referred to as a quiescent supply current (IDDQ) fault.

The IDDQ fault is referred to as a fault in which current from the power supply line rises from a normal state. It is frequently caused by a physical defect at a single portion. The reason therefore is detailed in the 125th research meeting document for the Japan Science Promotion Association 132 Committe, by Sanada et al., "Evaluation and Detection of CMOS-LSI with abnormal $I_{DDQ}$" pp.7–12, publised on Dec. 9, 1993.

It is possible to monitor the current flowing in the interconnection by using the OBIRCH/EBIRCH method, as mentioned above. Accordingly, in the fifth embodiment, a thin film having the characteristic of absorbing a radiation beam is formed on the surface of a chip 70 so as to effectively use the energy of the radiation beam in the OBIRCH/EBIRCH phenomenon as well as to suppress the OBIC/EBIC phenomenon by the thin film on the surface of the chip 70. Thereby, it is possible to find out a portion 72 having a physical defect generated on the route of the interconnection 71, as shown in FIG. 18B, by monitoring the current of the interconnection 71 by the OBIRCH/EBIRCH method.

FIG. 19A shows a result obtained by a fourth application example of the fifth embodiment. FIGS. 19B and 19C are enlarged views of the interconnection portions "B" and "C" encircled in FIG. 19A. FIGS. 19D and 19E are timing charts of the wave form of the currents in the interconnection portions. These figures show the example used to control or suppress the electromigration known as one of factors by which a life of the semiconductor IC is limited.

The electromigration is suppressed by maintaining the current flowing in the interconnection below a specified value. It is difficult to measure the value of the current flowing in the interconnection of an actual product in the conventional technique, so that the verification is difficult in the actual product after a design. Accordingly, there may be a risk that the actual product is involved in a trouble after a shipment to a market.

In this example, a thin film having the characteristic of absorbing a radiation beam is formed on the surface of the chip 73 including a reference interconnection 74 in which a predetermined reference current flows and a target interconnection 75 to be monitored, so as to effectively use the energy of the radiation beam in the OBIRCH/EBIRCH phenomenon as well as to suppress the OBIC/EBIC phenomenon by the thin film on the surface of the chip 73. Thereby, it is possible to monitor the current flowing in the interconnections 74 and 75 and to verify the normal current in the actual product.

In this embodiment, a quantitative estimation of the current is performed by comparing the waveform of the OBIRCH/EBIRCH signal (refer to FIG. 19E) in the interconnection 74, in which the reference current flows, with the waveform of the OBIRCH/EBIRCH signal (refer to FIG. 19D) in the interconnection 75 to be monitored, by using an oscilloscope and the like.

Figure 20A:
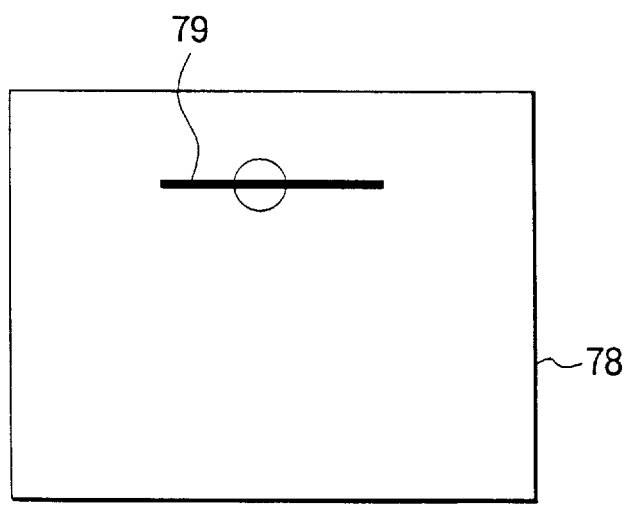
FIG. 20A is a plan view showing a fifth application example of the fourth, fifth, eight and ninth embodiment in accordance with the present invention.
Figure 20B:
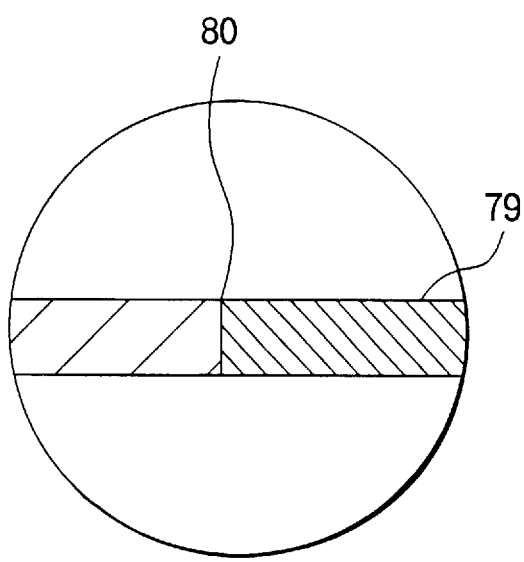
FIG. 20B is an enlarged partial view of an interconnection portion in FIG. 20A.

FIG. 20A shows a result obtained by a fifth application example of the fifth embodiment. FIG. 20B is the enlarged view of the interconnection portion encircled in FIG. 20A. These figures show an example of detecting a void 80 in an interconnection 79 or at a via (not shown here) without application of a voltage to a chip 78.

A fact that it is possible to observe the void 80 in the interconnection 79 or at the via (not shown here) without application of a voltage to the chip 78 is shown by an experiment as thermoelectric effect. This method is detailed by Koyama et al. in "Bias-free evaluation technique for Al interconnects with high sensitive OBIC" as mentioned before.

It is known that an OBIC current is generated even when the voltage is not applied to the chip 78, i.e., in a non-bias state. The non-bias method has been applied only to a test chip using the TEG method up to now. In the fifth embodiment of the present invention, the thin film for absorbing the radiation beam is formed on the surface of a chip product 78, so that the energy of the radiation beam is used effectively not only in the OBIRCH/EBIRCH phenomenon, but also in NB-OBIC/NB-EBIC phenomenon. In addition, the OBIC/EBIC phenomenon is suppressed by the thin film formed on the surface of the chip 78. A contrast is generated in the NB-OBIC/NB-EBIC image of the interconnection 79 between the left side and the right side of the void 80 constituting a boundary. Thereby, the void 80 in the interconnection 79 can be found easily in the present embodiment. The first through fifth application examples of the fifth embodiment described here could be application examples of fourth embodiment and fifth through eight embodiments.

Figure 21:
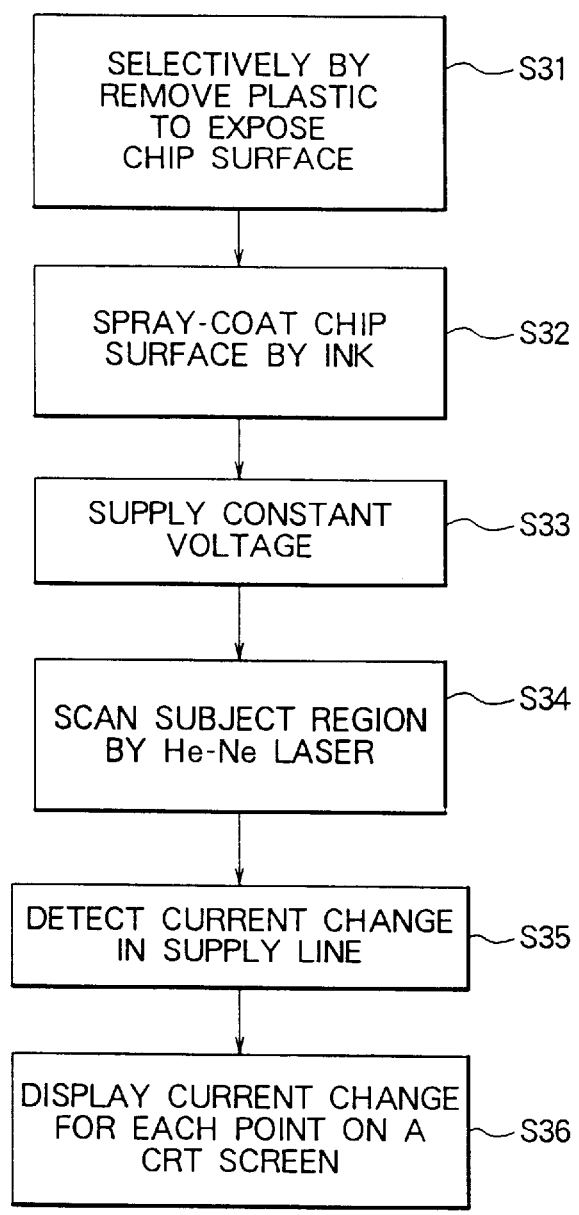
FIG. 21 is a flow chart showing a process of a sixth embodiment in accordance with the present invention.

FIG. 21 shows the process of a sixth embodiment in accordance with the present invention. The detection operation of the current change will be described with reference to the drawings. The configuration of an interconnection test system implementing the present embodiment is similar to that shown in FIG. 15.

An IC package 48 is prepared, in which a plastic material covering the upper surface of the IC chip 47 is selectively removed by melting using a fuming nitric acid and the like to expose the IC chip 47. The IC package 48 is placed on a sample table 49 which is moved in at least one of X axis direction, Y axis direction and Z axis direction to carry the IC chip 47 to an area irradiated by a laser beam 44 (Step S31).

Thereafter, a Chinese ink is applied to a predetermined area on the surface of the IC chip 47 by using an ink spray section 45 (Step S32). Then, the electric power is supplied from the power supply unit 50 to the IC chip 47 (Step S33). The electric power is supplied together with inputting a test pattern from the input terminal of the IC chip 47 to keep the IC chip 47 in a specified quiescent state. Under this state, the laser beam 44 generated by the He-Ne laser 41 is irradiated to the subject region to be observed on the IC chip 47. The subject region is scanned by the laser beam 44 (Step S34).

The current change detecting section 51 detects the change in the current supplied from the power supply unit to the IC chip 47 (Step S35). That is, the current change detecting section 51 detects the current change for each of the points in the subject region of the IC chip 47 while the each of the points is being scanned digitally. The signal processor 52 converts the current change detected by the current change detecting section 51 for each of the scanned points into the intensity variation and displays the same as an intensity distribution on the CRT screen of the image display section 53 (Step S36). In this case, the current change detected by the current change detecting section 51 may be converted to pseudo color data and displayed on the CRT screen of the image display section 53. The process from the step S31 to the step S36 is particularly suited to the first through the fifth application examples of the fifth embodiment, as described before.

Figure 22:
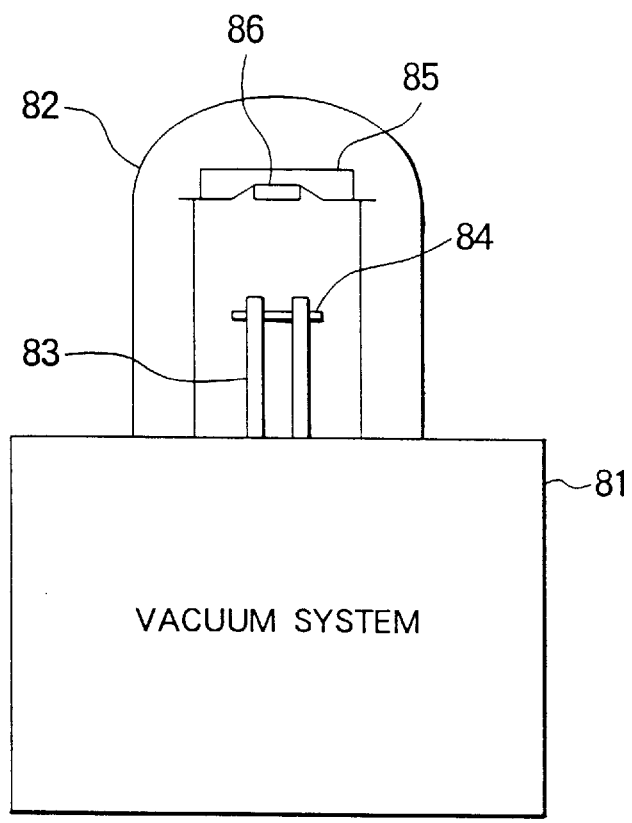
FIG. 22 is a schematic side view showing a carbon depositing equipment used in a seventh embodiment in accordance with the present invention.

FIG. 22 shows a carbon deposition system used in a seventh embodiment in accordance with the present invention. A vacuum system 81 including a control section therefore makes the inside of a belljar 82 vacuum while an IC package 85 is placed within the belljar 82. At this time, the IC package 85 is placed such that the top surface of the IC chip 86 is directed downward.

Thereafter, the vacuum system 81 introduces an inert gas to keep the inside of the belljar 82 at a pressure between 1 mTorr and 99 mTorr. Examples of the inert gas include Ar (argon), He (helium) and the like. Subsequently, a voltage is applied to electrodes 83 to evaporate carbon from a carbon rod 84. The carbon evaporated from the carbon rod 84 is deposited uniformly on the surface of the IC chip 86. In this case, since the inert gas is introduced within the belljar 82, the carbon adheres mildly onto the surface of the IC chip 86. Accordingly, the carbon will be readily removed later from the surface of the IC chip 86.

Figure 23A:
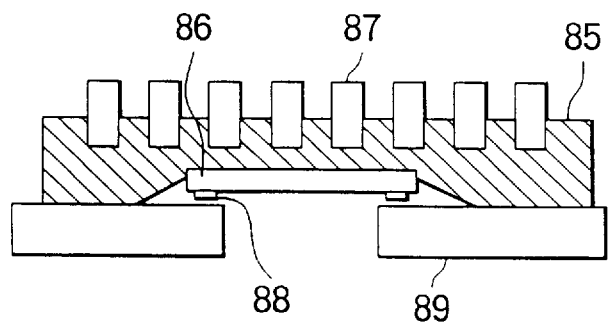
FIG. 23A is a cross-sectional view showing an example of an IC chip with a mask for depositing carbon by the carbon depositing equipment in FIG. 22.
Figure 23B:
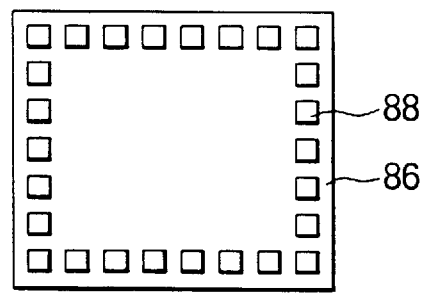
FIG. 23B is a plan view showing the IC chip of FIG. 23A before deposition of carbon.
Figure 23C:
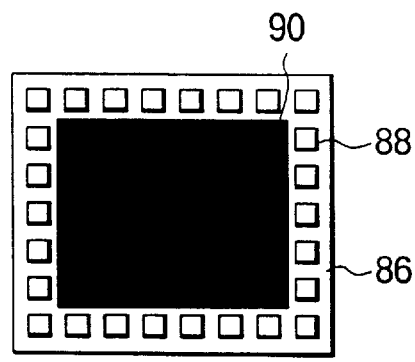
FIG. 23C is a plan view showing the IC chip of FIG. 23A after deposition of carbon.

FIGS. 23A–23C show an IC chip during a deposition by the carbon deposition system of FIG. 22. FIG. 23A shows the arrangement of a mask 89 during the deposition, while FIGS. 23B and 23C show the IC chip 86 before and after the deposition, respectively. These figures show the example that the mask 89 covers the area for pads 88 of the IC chip 86 so that the carbon is not deposited onto the pad area.

When carbon is to be deposited onto the surface of the IC chip 86 by the carbon deposition system of FIG. 22, the IC package 85 is placed on the mask 89 in the belljar 82 such that the top surface of the IC chip 85 is directed downward, while outer terminals 87 of the IC package 86 are directed upwards and that the pad 88 of the IC chip 86 is covered by the mask 89 as shown in FIG. 23A.

Thereafter, the carbon is evaporated from the carbon rod 84 by controlling the vacuum system 81. The carbon is accumulated gradually onto the central area of the IC chip 86 except for the pad 88. As a result, a thin film 90 made of carbon is formed on the central area of the IC chip 86 as shown in FIG. 23C. A CAD navigation system can be used in this chip because the carbon is not deposited onto the pad 88 of the IC chip 86.

Figure 24:
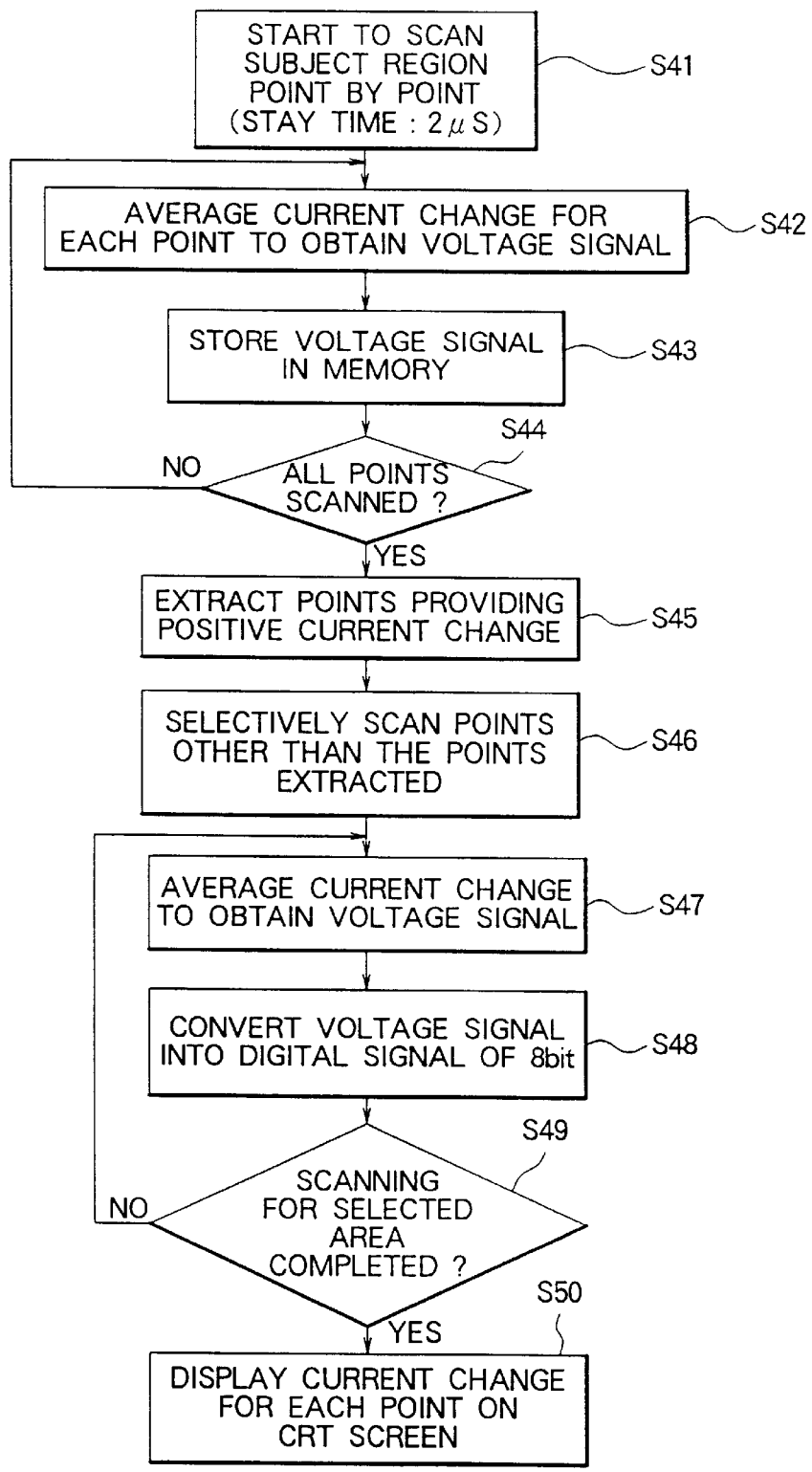
FIG. 24 is a flow chart showing a process of an eighth embodiment in accordance with the present invention.

FIG. 24 shows a process of an eighth embodiment in accordance with the present invention. FIG. 25A shows the principle of the present embodiment, and FIG. 25B shows selected area in the subject region to be scanned.

In FIG. 25A, the present embodiment selectively controls an irradiation area $31a$ of the beam 31 irradiated onto the integrated circuit 30 within the selected areas $91a$, $91b$, ... , $91f$ selected in the subject region 91 as shown in FIG. 25B. Thereby, it is possible to effectively use the energy of the beam 31 in the OBIRCH/EBIRCH phenomenon and to suppress the OBIC/EBIC phenomenon without irradiating the beam 31 to the other area optically exposing silicon to a surface in the subject region 91.

In the present embodiment, the scanning is not executed for the whole area of the subject region 91, i.e, not executed for the area wherein the OBIC current flows because of the optical exposure of silicon to the surface.

In order to avoid scanning the points at which the OBIC current flows, the amount of the current change for each of the scanned points is stored in advance while scanning the whole area of the subject region 91 in a preliminary scanning, i.e., a first scanning. Those points which provide positive values in the current change during the first scanning are not scanned during a subsequent second scanning. The selective scanning areas are selected based on the principle that the OBIC current change is positive while the OBIRCH current change is negative.

In FIG. 25A, when the second scanning is to be performed for the interconnection 32 by the beam 31, the beam 31 is irradiated only within the irradiation range in this embodiment. Then, the temperature T of the interconnection 32 rises to (T+ΔT) with the irradiated portion of the beam 31 as a heat center. Thereby, the resistance (R) of the interconnection 32 is increased to (R+ΔR) with the irradiated portion as a resistance increasing center.

When a constant voltage is applied to the interconnection 32, the current I flowing therethrough is decreased to I−ΔI in which ΔI is approximately proportional to the originally flowing current value I as follows:

$$\Delta I \propto \Delta R \times I.$$

Accordingly, estimation of the decrease ΔI provides the original current I.

Interconnections 32 are generally distributed within the whole area of the chip of the integrated circuit. Thus, it is substantially impossible to detect, from the outside of the chip, the amount of the currents flowing in the respective interconnections within the chip. However, in the present invention, the amount of the current change in the interconnection 32 to which the beam 31 is being irradiated is detected by monitoring the decreased amount of the current in the power supply line.

Based on the principle described above, it is possible to estimate the current in any of the interconnections.

Alternatively, by monitoring the current change in the power supply line, it is also possible to identify the faulty portions, for which it was difficult or impossible to do by using only the conventional method. Especially, in the eighth embodiment of the present invention, the energy of the beam 31 can be used effectively in the OBIRCH/EBIRCH phenomenon, providing an effective detection of the decrease in the supply current. Namely, if the irradiation areas 91a, 91b, ..., 91f are determined while skipping the silicon area optically exposed, current increase by the OBIC/EBIC phenomenon does not arise in the supply current.

Now, the process according to the eighth embodiment will be described in more detail with reference to FIGS. 24, 25A and 25B. An interconnection test system implementing the present embodiment is similar to that shown in FIG. 7 or FIG. 8, which will be additionally referred to.

In operation, the sample 6 is first moved by the sample table 7 such that the subject region 91 of the sample 6 is placed within the irradiation range of the laser/electron beam. Thereafter, the electric power is supplied from the power supply unit 8 to the sample 6.

Subsequently, the laser/electron beam is irradiated to the subject region 91 of the sample 6 for a first scanning, and the whole area of the subject region 91 is scanned point by point by the first scanning (Step S41). The stay time of the laser beam at each of the scanned points of the subject regions 91 is set at 2 $\mu$S. The current change detecting section 9 averages the current changes in the supply line within the stay time to obtain an average current change and converts the same into a voltage signal representing the current change (Step S42).

The current change detecting section 9 further carries out an A/D conversion for the voltage signal into a digital signal of 8 bits or 256 gradations and stores the same at a location in the memory corresponding to the coordinates at each of the scanned points (Step S43). It is judged whether or not scanning for all of the points in the subject region 91 has been completed (Step 44). If the scanning for the subject region 91 has not been completed, the process from the step S42 to the step S44 is repeated.

If the first scanning for all of the points has been completed in the subject region 91 of the sample 6, a control section (not shown) is informed of the fact. The control section reads out the voltage signal from the memory, judges whether the current change is positive or negative at each of the scanned points, extracts scanned points providing the positive current changes, and stores the coordinates thereof (Step S45). All of the voltage signals stored before in the memory are erased during the step S45.

Thereafter, the sample 6 is subjected to a second scanning. The control section controls the second scanning to skip the points providing positive current changes. In this case, the laser/electron beam is irradiated to selected areas 91a, 91b, ..., 91f of the subject region 91 as shown in FIG. 25B. Thereby, the laser/electron beam is irradiated selectively to the areas other than the silicon area optically exposed in the subject region 91 of the sample 6, while monitoring the current change in the power supply line. Thus, the selected areas 91a, 91b, ..., 91f are scanned selectively and point by point in the second scanning (Step S46). In this case, the stay time at each of the scanned points of the pattern areas 91a, 91b, ..., 91f is 2 $\mu$S. The current change detecting section 9 averages the current changes within the stay time and converts the averaged value into the voltage signal (Step S47).

The current change detecting section 9 carries out an A/D conversion of the voltage signal into a digital signal of 8 bits or 256 gradations and stores the same at the location of the memory corresponding to the coordinates at each of the scanned points (Step S48). It is judged whether or not scanning for all of the points in all of the selected pattern areas 91a, 91b, ..., 91f has been completed (Step S49). If the scanning for the pattern areas has not been completed, the process from the step S47 to the step S49 is repeated.

If the scanning for all of the points has been completed in the selected areas of the subject region 91 of the sample 6, the fact is informed to the image display section 10. The image display section 10 reads out the voltage signal stored in the memory, converts the same to intensity data or pseudo color data and displays the same on the CRT screen in the form of the 256 gradations at each of the points (Step S50).

As a result, the OBIRCH/EBIRCH image obtained for the selected areas 91a, 91b, ..., 91f in the subject region 91 is displayed on the CRT screen of the image display section 10. The present embodiment is suitably applied to the first through the fifth application examples of the fifth embodiment, similarly to the fifth embodiment.

Figure 26:
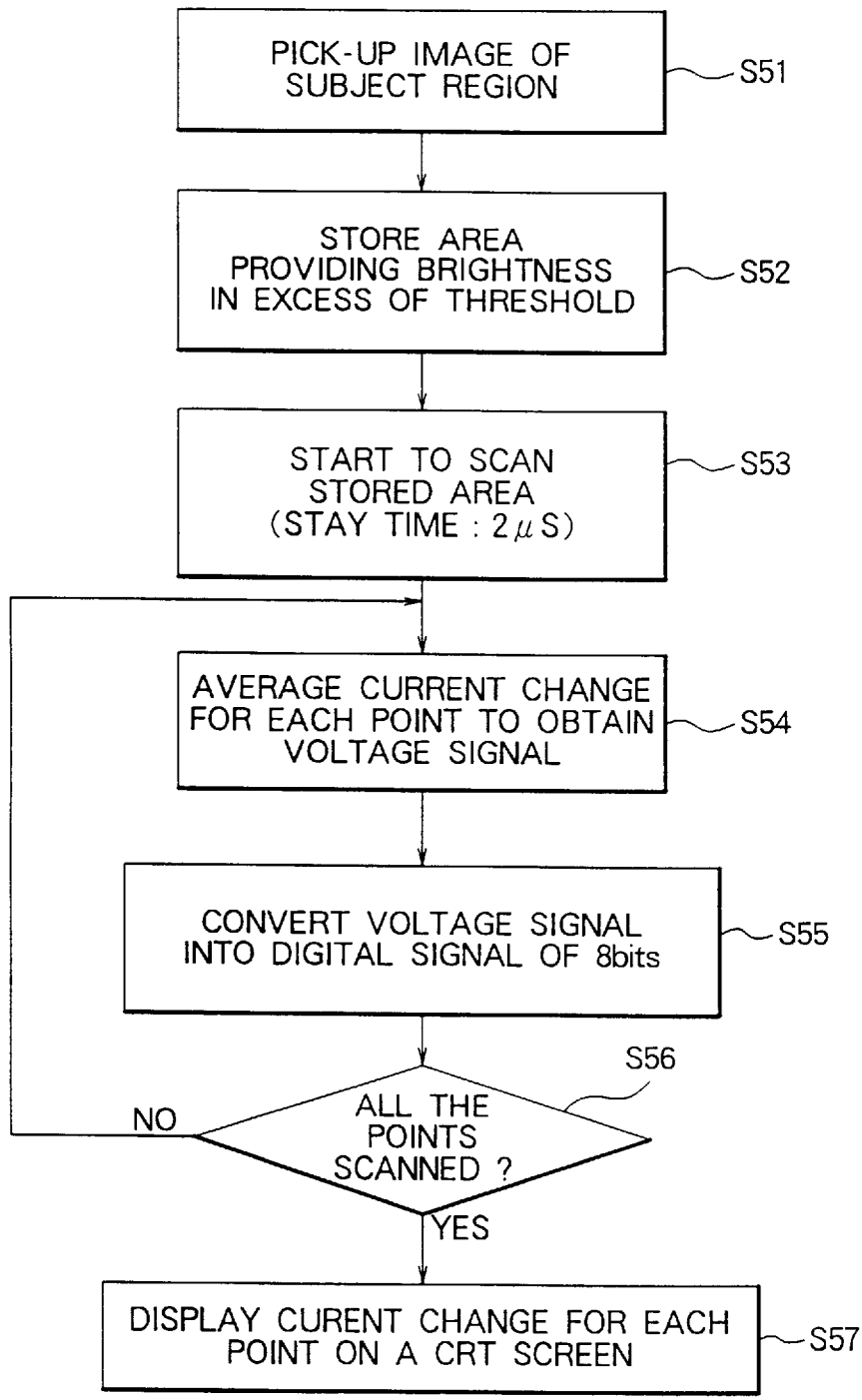
FIG. 26 is a flow chart showing a process of a ninth embodiment in accordance with the present invention.

FIG. 26 shows a process of a ninth embodiment in accordance with the present invention. The process according to the ninth embodiment will be described in detail with reference to FIGS. 25A, 25B and 26. An interconnection test system implementing the present embodiment is similar to that shown in FIG. 7 or FIG. 8, except that the test system has, for example, a laser microscope for pickup of the image of the subject region.

In operation, the sample 6 is first moved by the sample table 7 such that the subject region 91 of the sample 6 is placed within the irradiation range of the laser/electron beam. Thereafter, the image of the subject region 91 of the sample 6 is picked up by using a scanning system of the laser/electron beam and the laser microscope (Step S51).

The control section (not shown) extracts the points each exhibiting a brightness in excess of a predetermined threshold from the optical image of the subject region 91 of the sample 6, and stores in the memory the points providing the brightness, which may form selected areas 91a, 91b, ..., 91f (Step S52). The control section controls scanning by the laser/electron beam based on the stored selected areas 91a, 91b, ..., 91f. In this case, the laser/electron beam is irradiated to the selected areas 91a, 91b, ..., 91f in the subject region 91 of the sample 6, to which the electric power is supplied from the power supply unit 8.

The laser/electron beam is irradiated to each of the points having the brightness in excess of the threshold while the electric power is supplied from the power supply unit 8 to the sample 6. The scanning by the laser/electron beam is performed to each of the selected areas (Step S53). In this case, the stay time at each of the scanned points of the pattern areas 91a, 91b, ..., 91f is 2 $\mu$S. The current change detecting section 9 averages the current changes detected within the stay time and converts the averaged value into a voltage signal (Step S54).

The current change detecting section 9 carries out an A/D conversion of the voltage signal into a digital signal of 8 bits or 256 gradations, and stores the same at the location of the memory corresponding to the coordinates at each of the scanned points (Step S55). It is judged whether or not scanning for all of the points in each of the selected areas 91a, 91b, ..., 91f, that is, the scanning for all of the selected areas has been completed (Step S56). If the scanning in the selected areas has not been completed, the process from the step S54 to the step S56 is repeated.

After the scanning has been completed for the selected regions of the sample 6, the fact is informed to the image display section 10. The image display section 10 reads out the voltage signal stored in the memory, converts the same into intensity data or pseudo color data, and displays the same in the form of 256 gradations at each of the points of a matrix on the CRT screen corresponding to each of the scanned points in the selected areas (Step S57).

As a result, the OBIRCH/EBIRCH image obtained for the selected areas 91a, 91b, . . . , 91f of the subject region 91 is displayed on the CRT screen of the image display section 10. That is, in the ninth embodiment of the present invention, the points each having the brightness in excess of a predetermined threshold is stored from the optical image obtained by the laser microscope. Then, only these points constituting selected areas are scanned to obtain the OBIRCH/EBIRCH image in the second scanning.

The above method is based on the fact that the reflection coefficient of a portion of the interconnection is higher than the other portions of the chip including the silicon area optically exposed. A laser beam does not penetrate the interconnection, so that the OBIC current does not flow at the portion where the interconnection overlies. Thereby, the ninth embodiment is suitably applied to the first through the fifth application examples of the fifth embodiment, similarly to the fifth embodiment.

Figure 27A:
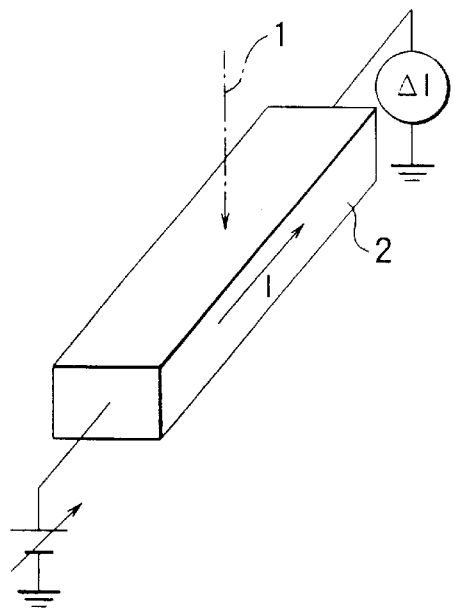
FIG. 27A is a perspective view for showing the principle of the application of the present invention to a current waveform measurement.
Figure 27B:
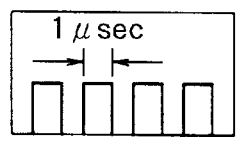
FIG. 27B is a timing chart of a laser beam used for a current waveform measurement in the present invention.
Figure 27C:
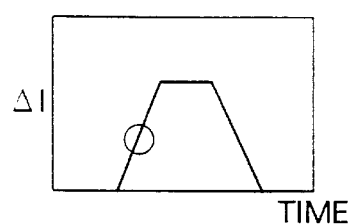
FIG. 27C is a timing chart of the current observed in the power supply line.
Figure 27D:
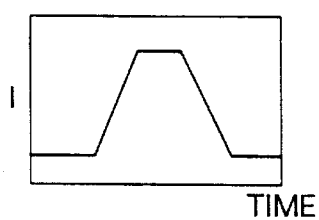
FIG. 27D is a timing chart of the current flowing in the interconnection of FIG. 27A.
Figure 27E:
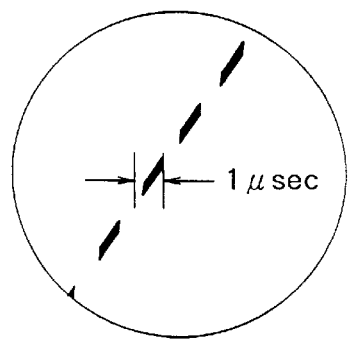
FIG. 27E is an enlarged timing chart of FIG. 27C.

FIGS. 27A to 27E show the principle of a tenth embodiment of an interconnection test method, wherein a current waveform in the interconnection is measured, according to the present invention. FIG. 27A shows a configuration of the test execution, FIG. 27B shows a waveform of the laser beam, FIG. 27C shows a waveform of the current monitored in the power supply line for the interconnection 2, FIG. 27D shows a waveform the current flowing in the interconnection 2, and FIG. 27E shows an enlarged waveform of a part encircled in FIG. 27C. In those figures, the laser beam 92 is irradiated to the interconnection 2 in a form of a pulse as shown in FIG. 27B. Current flows through the interconnection and from the power supply line as shown in FIG. 27D. These figures show a case that a period of the laser beam 92 is 2 $\mu$S, that the duty ratio thereof is ½ and that time period for each of the detections of the current change by the current change detecting section (not shown) is 1 $\mu$S.

Now, the present invention as described above will be summarized hereinafter, for a better understanding of the present invention.

While the electric power is supplied from the power supply unit to the sample and a focused radiation beam (laser beam, electron beam or ion beam) is irradiated to the interconnection, the current change for each of the scanned points in the subject region is detected by the current change detecting section which monitors the current change in the power supply line. The amount of the current change is converted into intensity data or pseudo color data and displayed at each of the points on the CRT screen of the image display section, thereby showing the current of the interconnection. Accordingly, a failure analysis can be performed differently from the conventional method. In particular, it is effective in detecting the anomaly of the interconnection in a lower layer interconnection in multi-level interconnection structure.

In one aspect of the present invention, the current changes detected by the current change detecting section are separated and displayed based on the threshold. Thereby, even if the interconnection and the active layer of the semiconductor, i.e., a p-n junction, for example, are mixed in the subject region, it is possible to detect defects in the interconnections by an analysis using the OBIRCH/EBIRCH and NB-OBIC/NB-EBIC methods in an actual product, for which it was difficult to do in the prior art.

In another aspect, a thin film having a low reflection coefficient to the radiation beam is formed on the subject region of a semiconductor chip, and the radiation beam is irradiated to the thin film while the current change in the supply line is detected. Thereby, even if a semiconductor active layer is exposed in the subject region, it is possible to find a defect in the interconnection or the via on the semiconductor chip. In this case, an analysis using the OBIRCH/EBIRCH method or observation using the non-bias method can be performed in an actual product, for which it was difficult to do in the prior art.

In another aspect, a first and a second scanning operations by the radiation beam are performed to the subject region, wherein the second scanning is conducted to the selected areas for which the current change observed in the first scanning is negative. Thereby, the second scanning can be performed only to the interconnection to localize a faulty portion in the interconnection even if a silicon area is optically exposed in the subject region.

In another aspect, the radiation beam is irradiated to only the points having a brightness in excess of a predetermined threshold in the optical image of the sample while the current change is detected. Thereby, even if the semiconductor active layer is optically exposed in the subject region, it is possible to find a defect in the interconnection or the via in the semiconductor chip by an analysis using the OBIRCH/EBIRCH method or observation using the non-bias method in an actual product, for which it was difficult to do in the prior art.

The present invention may have additional embodiments for testing an interconnection by monitoring a current change in the interconnection so as to estimate or measure current in the interconnection or to find a defect in the interconnection, which will be enumerated hereinafter together with the preferred embodiments as described above.

(1) A method for testing an interconnection in a semiconductor integrated circuit including the steps of providing a constant supply voltage to the semiconductor integrated circuit through a power supply line, irradiating a radiation beam to scan points of a matrix constituting a subject region including at least a portion of the interconnection, monitoring a current change in the power supply line for each of the points while the each of the points is being irradiated by the radiation beam, and displaying the current change for each of the points.

(2) A method for testing an interconnection as recited in item (1), wherein the radiation beam is an ion beam.

(3) A method for testing an interconnection as recited in item (1), wherein the radiation beam is one of a laser beam and an electron beam.

(4) A method for testing an interconnection as recited in any one of items (1) through (3), wherein the subject region includes a first subject region including at least a portion of a first interconnection and a second subject region including at least a portion of a second interconnection, wherein the displaying includes displaying both the current change for the first subject region and the current change for the second subject region on the display panel.

(5) A method for testing an interconnection as recited in any one of items (1) through (4), wherein the current change to be displayed on the display panel is obtained by a plurality of scannings for the subject region in which the radiation beam is focused in different heights to obtain a plurality of data, by storing the plurality of data in a memory and by reading-out and adding the plurality of data.

(6) A method for testing an interconnection including the steps of providing a constant supply voltage to the semiconductor integrated circuit through a power supply line, irradiating a radiation beam to a point in a subject region including at least a portion of the interconnection, monitoring a current change in the power supply line for the point while the point is being irradiated by the radiation beam, converting the current change caused by the beam irradiation into a current value, displaying the current value in a waveform.

(7) A method for testing an interconnection as recited in item (6), wherein the radiation beam is an ion beam.

(8) A method for testing an interconnection as recited in item (6), wherein the radiation beam is one of a laser beam and an electron beam.

(9) A method for testing an interconnection as recited in any one of items (6) through (8) wherein the subject region includes a first subject region including at least a portion of a first interconnection and a second subject region including at least a portion of a second interconnection, wherein the displaying includes displaying both the current change for the first subject region and the current change for the second subject region on the display panel.

(10) An interconnection test system for testing an interconnection in a semiconductor integrated circuit, the system comprising a power supply unit for supplying a constant supply voltage to the semiconductor integrated circuit through a power supply line, an irradiating section for irradiating a radiation beam onto the surface of the semiconductor integrated circuit, a scanning section for scanning points of a matrix constituting a subject region of the semiconductor integrated circuit, the subject region including at least a portion of the interconnection, a current change detector, operatively connected to the power supply line, for detecting a current change in the power supply line for each of the points while the each of the points is being irradiated by the radiation beam, and a display panel for displaying thereon the current change for at least a part of the points.

(11) An interconnection test system for testing an interconnection as recited in item (10), wherein the radiation beam is an ion beam.

(12) An interconnection test system for testing an interconnection as recited in item (10), wherein the radiation beam is one of a laser beam and an electron beam.

(13) An interconnection test system for testing an interconnection as recited in any one of items (10) through (12), wherein the subject region includes a first subject region including at least a portion of a first interconnection and a second subject region including at least a portion of a second interconnection, wherein the display panel displays both the current change for the first subject region and the current change for the second subject region.

(14) An interconnection test system for testing an interconnection as recited in any one of items (10) through (13), wherein the data for the current change to be displayed on the display panel is obtained by a plurality of scannings in which the irradiation beam is focused in different heights to obtain a plurality of data in each of the scannings, by storing the plurality of data and by adding the plurality of data.

(15) An interconnection test system for testing an interconnection in a semiconductor integrated circuit, the system comprising a power supply unit for supplying a constant supply voltage to the semiconductor integrated circuit through a power supply line, an irradiating section for irradiating a radiation beam onto the surface of the semiconductor integrated circuit, a scanning section for scanning points of a matrix constituting a subject region of the semiconductor integrated circuit, the subject region including at least a portion of the interconnection, a current change detector, operatively connected to the power supply line, for detecting a current change in the power supply line for each time when the current value changes in a waveform and for converting the current change to the current value for the each time, a display panel for displaying the detected current changes in a waveform of the current.

(16) An interconnection test system for testing an interconnection as recited in item (15), wherein the radiation beam is an ion beam.

(17) An interconnection test system for testing an interconnection as recited in item (15), wherein the radiation beam is one of a laser beam and an electron beam.

(18) An interconnection test system for testing an interconnection as recited in any one of items (15) through (17), wherein the at least one subject region includes a first subject region including at least a portion of a first interconnection and a second subject region including at least a portion of a second interconnection, wherein the display panel displays both the current change for the points in the first subject region and the second subject region.

(19) A method for testing an interconnection including the steps of forming a film for absorbing energy of a radiation beam on the surface of the chip of the semiconductor integrated circuit, providing a constant supply voltage to the semiconductor integrated circuit through a power supply line, irradiating the radiation beam to scan points of a matrix constituting the subject region, monitoring a current change in the power supply line for each of the points while the each of the points is irradiated by the radiation beam, estimating the current change for each of the points, and localizing at least one suspected portion in the subject region based on the estimated current change.

(20) A method for testing an interconnection as recited in item (19), wherein the radiation beam is one of a laser beam and an electron beam.

(21) A method for testing an interconnection as recited in items (19) or (20), wherein the subject region includes a first subject region including at least a portion of a first interconnection and a second subject region including at least a portion of a second interconnection, wherein the displaying includes displaying both the current change for the first subject region and the current change for the second subject region on the display panel.

(22) A method for testing an interconnection as recited in any one of items (13) through (21) wherein the displaying for the each of the points is implemented by displaying the current change in gradation at a corresponding one of grids of the display panel based on the magnitude of the current change.

(23) A method for testing an interconnection as recited in any one of items (19) through (21), wherein the detected current change is displayed as a waveform of the current.

(24) A method for testing an interconnection as recited in any one of items 19 through 23 further including the step of estimating the current change based on the magnitude thereof with respect to at least one threshold.

(25) A method for testing an interconnection as recited in item (24), wherein the displaying includes displaying in one of gradation and color.

(26) A method for testing an interconnection as recited in any one of items (19) through (25) except for (23) further including the step of specifying at least one selected area in the subject region based on the estimated current change, and selectively scanning the selected area by the radiation beam.

(27) A method for testing an interconnection as recited in any one of items (19) through (26) except for (23), wherein the step of selecting includes storing in a memory the at least one suspected area to be localized.

(28) A method for testing an interconnection as recited in any one of items (19) through (26), wherein the step of selecting includes making a mark for the suspected area in the chip.

(29) A method for testing an interconnection as recited in item 28 further including the step of removing the film from the surface of the semiconductor integrated circuit while leaving the mark.

(30) A method for testing an interconnection in a semiconductor integrated circuit including the steps of forming a film for absorbing energy of a radiation beam on the surface of a subject region including at least a portion of the interconnection, irradiating the radiation beam to scan points of a matrix constituting the subject region without providing a bias voltage, monitoring a current change at each of the points while the each of the points is being irradiated by the radiation beam, and displaying the current change for each of the points while the each of the points is irradiated by the radiation beam, and localizing at least one suspected portion in the subject region based on the estimated current changes.

(31) A method for testing an interconnection as recited in item (30), wherein the radiation beam is one of a laser beam and an electron beam.

(32) A method for testing an interconnection as recited in item (30) or (31), wherein the subject region includes a first subject region including at least a portion of a first interconnection and a second subject region including at least a portion of a second interconnection, wherein the displaying includes displaying both the current change for the first subject region and the current change for the second subject region on the display panel.

(33) A method for testing an interconnection as recited in any one of items (30) through (31), wherein the displaying for the each of the points is implemented by displaying the current change in gradation at a corresponding one of grids of a display panel based on the magnitude of the current change.

(34) A method for testing an interconnection as recited in any one of items (30) through (33), wherein the detected current change is displayed as a waveform of the current change.

(35) A method for testing an interconnection as recited in any one of items (30) through (33) further including the step of estimating the current change based on the magnitude thereof with respect to at least one threshold.

(36) A method for testing an interconnection as recited in item (35), wherein the displaying includes displaying in one of gradation and color.

(37) A method for testing an interconnection as recited in any one of items (30) through (36) further including the step of selecting at least one area in the subject region, and selectively scanning the selected area.

(38) A method for testing an interconnection as recited in any one of items (30) through (37), wherein the step of selecting includes storing in a memory the at least one suspected area to be localized.

(39) A method for testing an interconnection as recited in any one of items (30) through (37), wherein the step of selecting includes making a mark for the suspected area in the chip.

(40) A method for testing an interconnection as recited in item (39) further including the step of removing the film from the surface of the semiconductor integrated circuit while leaving the mark.

(41) An interconnection test system for testing an interconnection in a semiconductor integrated circuit, the system comprising means for forming a film for absorbing a radiation beam on the surface of the semiconductor integrated circuit, means for providing a constant supply voltage to the semiconductor integrated circuit through a power supply line, an irradiating section for irradiating the radiation beam onto the surface of the semiconductor integrated circuit, a scanning section for scanning points of a matrix constituting a subject region of the semiconductor integrated circuit, the subject region including at least a portion of the interconnection, a current change detector for detecting a current change for each of the points while the each of the points is being irradiated by the irradiation beam, a display panel for displaying thereon the current change for each of the points at a corresponding one of grids of the display panel

(42) An interconnection test system for testing an interconnection as recited in item (41), wherein the radiation beam is one of a laser beam and an electron beam.

(43) An interconnection test system for testing an interconnection as recited in item (41) or (42), wherein the display panel displays both a first current change for the points of a first subject region and a second current change for the points of a second subject region, the first subject region including at least a portion of a first interconnection to be tested, the second subject region including at least a portion of a second interconnection to be referenced.

(44) An interconnection test system for testing an interconnection as recited in any one of items (41) through (43), wherein the display panel displays the current change in gradation at each of grids of the display panel based on the magnitude of the current change for a corresponding one of the points in the subject region.

(45) An interconnection test system for testing an interconnection as recited in any one of items (41) through (44), wherein the display panel displays the current change as a waveform of the current.

(46) An interconnection test system for testing an interconnection as recited in any one of items (41) through (44) further including an estimating section for estimating the current change based on the magnitude thereof with respect to at least one threshold.

(47) An interconnection test system for testing an interconnection as recited in item (46), wherein the display panel displays the current change in one of gradation and color.

(48) An interconnection test system for testing an interconnection as recited in any one of items (41) through (47) except for (45) further including a selecting means for selecting at least one area in the subject region based on the estimated current change, and selectively scanning the selected area by the radiation beam.

(49) An interconnection test system for testing an interconnection as recited in any one of items (41) through (48), wherein the selecting means stores in a memory at least one suspected area to be localized.

(50) An interconnection test system for testing an interconnection as recited in any one of items (41) through (48), wherein the selecting means makes a mark for the pattern area in the chip.

(51) An interconnection test system for testing an interconnection as recited in item (50), wherein the selecting means removes the absorbing film from the surface of the semiconductor integrated circuit while leaving the mark.

(52) An interconnection test system for testing an interconnection in a semiconductor integrated circuit, comprising an irradiating section for irradiating a radiation beam onto the surface of the semiconductor integrated circuit, a scanning section for scanning points of a matrix constituting a subject region of the semiconductor integrated circuit, the subject region including at least a portion of the interconnection, a current change detector for detecting a current change for each of the points while the each of the points is being irradiated by the radiation beam, and a display panel for displaying thereon the current change for each of the points at a corresponding one of grids of the display panel.

(53) An interconnection test system for testing an interconnection as recited in item (52), wherein the radiation beam is one of the laser beam and the electron beam.

(54) An interconnection test system for testing an interconnection as recited in item (52) or (53), wherein display panel displays both a first current change for the points of a first subject region and a second current change for the points of a second subject region, the first subject region including at least a portion of a first interconnection to be tested, the second subject region including at least a portion of a second interconnection to be referenced.

(55) An interconnection test system for testing an interconnection as recited in any one of items (52) through (54), wherein the display panel displays the current change in gradation at each of grids of the display panel based on the magnitude of the current change for a corresponding one of the points in the subject region.

(56) An interconnection test system for testing an interconnection as recited in any one of items (52) through (54), wherein the detected current change is displayed as a waveform of the current.

(57) An interconnection test system for testing an interconnection as recited in any one of items (52) through (55) further including an estimating section for estimating the current change based on the magnitude thereof with respect to at least one threshold.

(58) An interconnection test system for testing an interconnection as recited in item (57), wherein the display panel displays the current change in one of gradation and color.

(59) An interconnection test system for testing an interconnection as recited in item (57) or (58) further including a selecting means for selecting at least one area in the subject region based on the estimated current change, and selectively scanning the selected area by the radiation beam.

(60) An interconnection test system for testing an interconnection as recited in any one of items (57) through (59), wherein the selecting means stores in a memory at least one suspected area to be localized.

(61) An interconnection test system for testing an interconnection as recited in any one of items (57) through (59), wherein the selecting means makes a mark for the area in the chip.

(62) An interconnection test system for testing an interconnection as recited in item (61), wherein the selecting means removes the absorbing film from the surface of the semiconductor integrated circuit while leaving the mark.

In the method and system for testing the interconnection according to the present invention, by monitoring the current change of an interconnection in a semiconductor integrated circuit, it is possible to analyze the defect in the interconnection or measure current in the interconnection. Especially, it is possible to provide an effective means for detecting the abnormality of the interconnection in the lower layer portion of the multilevel interconnection, for which it was difficult to detect by using the prior art.

Even in a case where the interconnection and active layer of the semiconductor including a p-n junction are mixed in the subject region, it is possible to inspect the interconnection including vias of the semiconductor integrated circuit (1) by estimating and displaying the detected result of the current change based on a threshold, (2) by forming a film for absorbing the radiation beam on the semiconductor integrated circuit, or (3) by selectively irradiating the radiation beam to selected areas in the subject region. Hence, it is possible to monitor the interconnection by using the OBIRCH/EBIRCH method or the non-bias method (NB-OBIC/NB-EBIC) in an actual product. Especially, it is possible to provide an effective means for detecting the abnormality of the interconnection in the lower layer portion of the multi-level interconnection or estimating current in the interconnection.

Since above embodiments are described only for examples, the present invention is not limited to such embodiments and it will be obvious for those skilled in the art that various modifications or alterations can be easily made based on the above embodiments within the scope of the present invention.

What is claimed is:

1. A method for measuring current in an interconnection made of a conductive material in a semiconductor integrated circuit including the steps of providing a constant supply voltage to the semiconductor integrated circuit through a power supply line, irradiating a radiation beam to scan points of a matrix constituting a subject region including at least a portion of the interconnection, monitoring a current change in the power supply line for each of the points on the portion of the interconnection while the each of the points is irradiated by the radiation beam, displaying the current change for at least a part of the points on a display panel, and measuring current in the interconnection based on the current change.

2. A method for measuring current in an interconnection as defined in claim 1 wherein the radiation beam is an ion beam.

3. A method for measuring current in an interconnection as defined in claim 1 wherein the radiation beam is selected from a laser beam and an electron beam.

4. A method for measuring current in an interconnection as defined in claim 3 further including the step of selecting at least one area for irradiation in the subject region.

5. A method for measuring current in an interconnection as defined in claim 4 wherein said selecting is performed based on the magnitude of the current change.

6. A method for measuring current in an interconnection as defined in claim 4 wherein said selecting is performed, before said irradiating, based on the magnitude of reflectance at each of the points.

7. A method for measuring current in an interconnection as defined in claim 3 further including the step of estimating the current change for each of the points based on the magnitude thereof with respect to at least one threshold.

8. A method for measuring current in an interconnection as defined in claim 3 further including the step of forming a film for absorbing the radiation beam before said irradiating the radiation beam.

9. A method for localizing a faulty portion in an interconnection including the method as defined in claim 1.

10. A method for detecting a physical defect in an interconnection made of a conductive material in a semiconductor integrated circuit including the steps of providing a constant supply voltage to the integrated circuit through a supply line, selecting at least one area including a portion of the interconnection in a subject region of the integrated circuit, irradiating a radiation beam selected from a laser beam and an electron beam to scan points of a matrix constituting the selected area, monitoring a current change in the supply line for each of the points on the portion of the interconnection while the each of the points is being irradiated by the radiation beam, displaying the current change for at least a part of the points on a display panel, and detecting a physical defect in the interconnection based on the current change.

11. A method for measuring current in an interconnection as defined in claim 10 wherein said selecting is performed based on the magnitude of the current change.

12. A method for measuring current in an interconnection as defined in claim 10 wherein said selecting is performed based on the magnitude of reflectance of each of the points.

13. A method for detecting a physical defect in an interconnection as defined in claim 10 further including the step of estimating the current change at each of the points based on the magnitude thereof with respect to at least one threshold.

14. A method for detecting a physical defect in an interconnection made of a conductive material in an integrated circuit including the steps of irradiating, in a non-bias state of the integrated circuit, a radiation beam selected from an electron beam and an ion beam to scan points of a matrix constituting a subject region including at least a portion of the interconnection, monitoring a current change for each of the points on the portion of the interconnection while the each of the points is being irradiated by the radiation beam, displaying the current change for at least a part of the positions on a display panel, and detecting a physical defect in the interconnection based on the current change.

15. A method for detecting a physical defect in an interconnection made of a conductive material including the steps of selecting at least one area including at least a portion of the interconnection, irradiating, in a non-bias state of the integrated circuit, a radiation beam to the integrated circuit to scan points of a matrix constituting the selected area, monitoring a current change for each of the points on the portion of the interconnection while the each of the points is irradiated by the radiation beams displaying the current change for at least a part of the points on a display panel, and detecting a physical defect in the interconnection based on the current chance.

16. A method for measuring current in an interconnection as defined in claim 15 wherein said selecting is performed based on the magnitude of the current change.

17. A method for measuring current in an interconnection as defined in claim 15 wherein said selecting is performed based on the magnitude of reflectance of each of the points.

18. A method for detecting a physical defect in an interconnection as defined in claim 15 further including the step of estimating the current (change at each of the points based on the magnitude with respect to at least one threshold.

\* \* \* \* \*